(12) United States Patent
Maydar et al.

(10) Patent No.: US 12,406,963 B2
(45) Date of Patent: Sep. 2, 2025

(54) WAFER LEVEL INTEGRATION OF TRANSDUCER ELEMENTS, TECHNIQUES AND IMPLEMENTATIONS

(71) Applicant: ELTA SYSTEMS LTD., Ashdod (IL)

(72) Inventors: Yaniv Maydar, Tel Aviv (IL); Gil Peshes, Kidron (IL); Michael Kedem, Ashdod (IL)

(73) Assignee: ELTA SYSTEMS LTD., Ashdod (IL)

( * ) Notice: Subject to any disclaimer, the term of this patent is extended or adjusted under 35 U.S.C. 154(b) by 438 days.

(21) Appl. No.: 18/003,364

(22) PCT Filed: Jun. 29, 2021

(86) PCT No.: PCT/IL2021/050794
§ 371 (c)(1),
(2) Date: Dec. 27, 2022

(87) PCT Pub. No.: WO2022/003681
PCT Pub. Date: Jan. 6, 2022

(65) Prior Publication Data
US 2023/0317679 A1    Oct. 5, 2023

(30) Foreign Application Priority Data

Jun. 29, 2020 (IL) .......................................... 275736

(51) Int. Cl.
*H01L 25/065* (2023.01)
*H01L 23/00* (2006.01)
(Continued)

(52) U.S. Cl.
CPC ...... *H01L 25/0655* (2013.01); *H01L 23/3128* (2013.01); *H01L 23/5384* (2013.01);
(Continued)

(58) Field of Classification Search
CPC ............. H01L 25/0655; H01L 23/3128; H01L 23/5384; H01L 23/5385
See application file for complete search history.

(56) References Cited

U.S. PATENT DOCUMENTS

| 5,646,828 A | 7/1997 | Degani et al. |
| 6,404,648 B1 * | 6/2002 | Slupe .................. H01L 25/0657 174/557 |

(Continued)

*Primary Examiner* — Thao P Le
(74) *Attorney, Agent, or Firm* — Ballard Spahr LLP

(57) ABSTRACT

An integrated circuit assembly and a method for fabricating the same are disclosed. The integrated circuit assembly includes: a base structure including an interposer board and a plurality of interfacing dies electrically coupled to said interposer board; a cap structure including an intermediating board and a panel of active elements having a plurality of active elements electrically coupled to the intermediating board. The cap structure is attached to the base structure such that the active elements are electrically coupled to the interfacing dies. Also disclosed are a tile including a back-end circuit board configured to attach to the plurality of integrated circuits and provide electrical connectivity thereto the plurality of integrated circuits, and a method of fabricating the same, as well as an array of the plurality of such tile in cascade connection.

20 Claims, 11 Drawing Sheets

(51) Int. Cl.
    *H01L 23/31*     (2006.01)
    *H01L 23/538*     (2006.01)
    *H01L 25/00*     (2006.01)

(52) U.S. Cl.
    CPC .......... *H01L 23/5385* (2013.01); *H01L 24/96* (2013.01); *H01L 25/50* (2013.01); *H01L 2224/96* (2013.01)

(56) References Cited

U.S. PATENT DOCUMENTS

| | | | |
|---|---|---|---|
| 8,759,150 B2* | 6/2014 | Hu | H01L 23/49827 438/107 |
| 9,806,061 B2* | 10/2017 | Shen | H01L 21/4882 |
| 11,302,673 B2* | 4/2022 | Yang | H01L 24/19 |
| 11,942,408 B2* | 3/2024 | Chen | H01L 23/49827 |
| 12,266,545 B1* | 4/2025 | Mirkarimi | H01L 25/18 |
| 2005/0146004 A1 | 7/2005 | Seto | |
| 2013/0187292 A1 | 7/2013 | Semmelmeyer et al. | |
| 2014/0054798 A1 | 2/2014 | Bowles | |
| 2014/0061948 A1 | 3/2014 | Bowles et al. | |
| 2014/0147972 A1* | 5/2014 | Semmelmeyer | H05K 1/0201 438/109 |
| 2014/0374917 A1 | 12/2014 | Weber et al. | |
| 2017/0221858 A1 | 8/2017 | Yu et al. | |
| 2018/0138145 A1 | 5/2018 | Lin | |
| 2018/0269183 A1* | 9/2018 | Kim | H01L 23/08 |
| 2018/0308791 A1* | 10/2018 | Zhao | H01L 21/565 |
| 2018/0350786 A1 | 12/2018 | Hung et al. | |
| 2019/0380234 A1 | 12/2019 | Grober et al. | |
| 2023/0369156 A1* | 11/2023 | Yang | H01L 24/08 |
| 2024/0063066 A1* | 2/2024 | Karhade | H01L 23/481 |
| 2024/0096728 A1* | 3/2024 | Seol | H01L 25/50 |
| 2024/0170459 A1* | 5/2024 | Hwang | H01L 24/92 |
| 2024/0194542 A1* | 6/2024 | Park | H01L 25/0655 |
| 2024/0203960 A1* | 6/2024 | Lee | H01L 24/08 |
| 2024/0321754 A1* | 9/2024 | Darmawikarta | H01L 23/15 |
| 2024/0339411 A1* | 10/2024 | Wu | H01L 23/5384 |
| 2024/0421102 A1* | 12/2024 | Peng | H01L 25/0655 |
| 2025/0006676 A1* | 1/2025 | Seol | H01L 24/05 |
| 2025/0006682 A1* | 1/2025 | Ying | H01L 25/105 |
| 2025/0008749 A1* | 1/2025 | Lee | H01L 25/18 |
| 2025/0105156 A1* | 3/2025 | Ecton | H01L 23/5381 |
| 2025/0105159 A1* | 3/2025 | Han | H01L 23/3128 |
| 2025/0105222 A1* | 3/2025 | Duan | H01L 25/0652 |

* cited by examiner

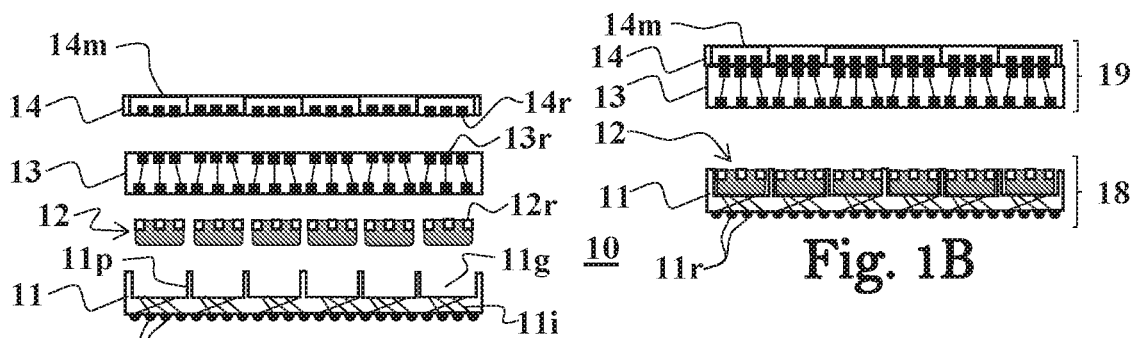
Fig. 1A  Fig. 1B
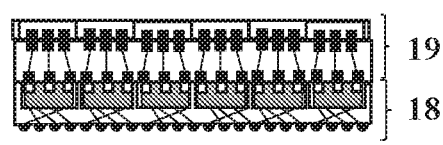
Fig. 1C
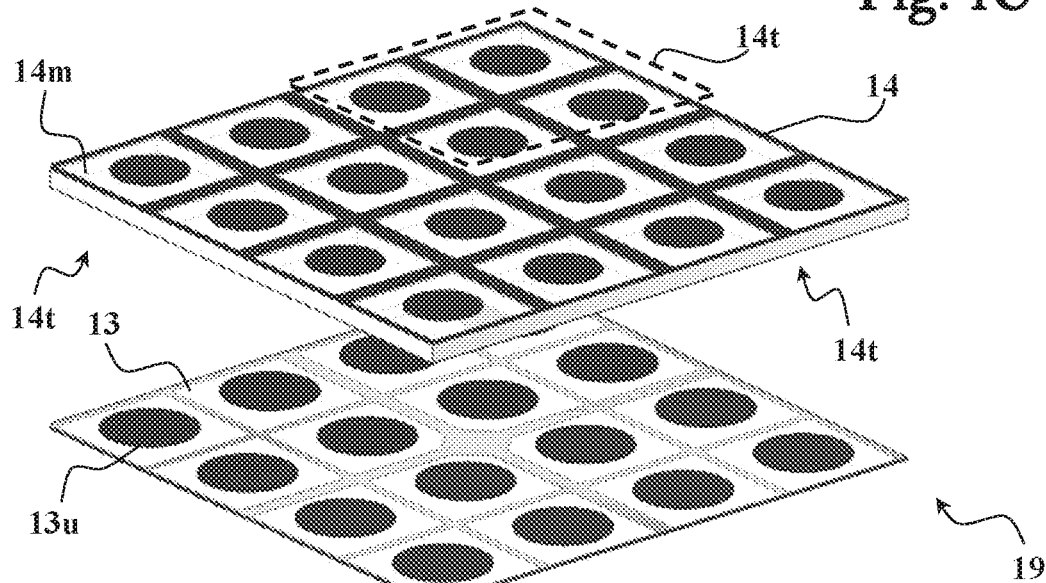
Fig. 2A
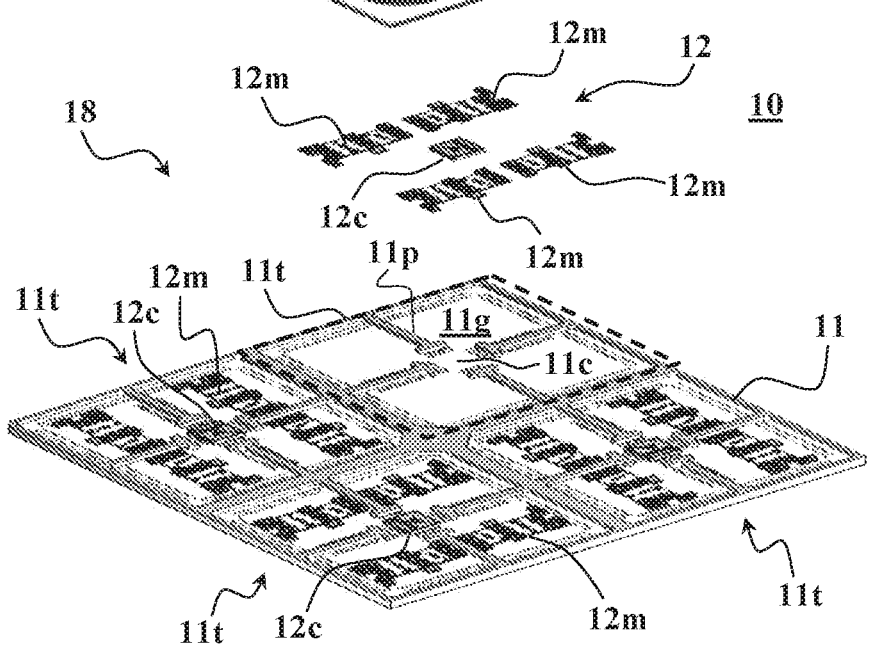

WAFER LEVEL INTEGRATION OF TRANSDUCER ELEMENTS, TECHNIQUES AND IMPLEMENTATIONS

TECHNOLOGICAL FIELD

The present invention is generally in the field of integrated circuits (IC) having embedded active elements.

BACKGROUND

Techniques for assembly, packaging and interconnection of sensor elements in integrated circuit structures are being developed and improved as demand and technology evolve. Many sensor devices are embedded nowadays into integrated circuit structures utilizing different integration techniques. For example, chip-scale-package (CSP) techniques can be used to integrate sensor elements and other circuitries into miniature, lightweight and portable ICs. These techniques can be further employed to integrate MEMS, optical and/or fluidic elements, into the sensor chips. Surface-mounting techniques are typically used to mount and electrically couple the micro-devices to a circuit board (e.g., printed circuit board—PCB) with a packaging element which size is slightly larger than the size of the circuit board (near chip scale encapsulation).

Lead-frame moulding can be used to package the ICs, typically using plastic materials moulded over metallic lead frame carriers, to provide quad flat no-leads (QFN) packages. ICs having micro ball-grid-arrays can be similarly manufactured using instead of the lead-frames organic high density substrates. These techniques provide ICs having fine pitch/grid for mounting and electrically coupling to a circuit board.

Multi-chip packaging techniques can be used to construct ICs with highly functional systems combining sensor elements with analogue and digital circuits, implemented as system-in-package (SiP) or system-on-package (SoP). The traditional design of sensor chips with their respective signal and data-processing circuitries in a side-by-side conformation, is changing nowadays into stack structures of thinned chips interconnected by wire bonding techniques.

Some solutions know from the patent literature are briefly described below.

In US Patent Publication No. 2014/374917 a vertically integrated hybrid component is implemented in the form of a wafer level package including: at least two element substrates assembled one above the other; a moulded upper sealing layer made of an electrically insulating casting; and an external electrical contacting of the component being implemented on the top side via at least one contact stamp which is embedded in the sealing layer so that (i) its lower end is connected to a wiring level of an element substrate and (ii) its upper end is exposed in the surface of the sealing layer.

US Patent Publication No. 2014/061948 describes a method comprising providing a structure, providing a controller element, and bonding the controller element to an outer surface of the structure. The structure includes a sensor wafer and a cap wafer. Inner surfaces of the wafers are coupled together, with sensors interposed between the wafers. One wafer includes a substrate portion with bond pads formed on its inner surface. The other wafer conceals the substrate portion. After bonding, conductive elements are formed on the element, material sections are removed from the wafers to expose the bond pads, electrical interconnects are formed, packaging material is applied, and sensor packages are singulated.

GENERAL DESCRIPTION

There is a need in the art for techniques for embedding active elements in integrated circuits during wafer level fabrication stages. The traditional capping techniques used nowadays are not suitable for multilayered stacking of wafers with active elements because they prohibit using wire bonding techniques to interconnect between the wafers. The present application provides techniques and implementations for overcoming this difficulty and simplifying the fabrication process utilizing wafer level integration schemes.

The term active element is generally used herein to refer to elements capable of interacting with, and/or sensing conditions or properties (e.g., pressure, temperature, strain, flow, transparency, turbidity, inductance, electrical resistance, electrical permeability, dielectric properties, or suchlike and any combination thereof) of a medium external to the device comprising the active element, and/or interact with, and/or sense conditions or properties of the device itself (e.g., velocity, acceleration, orientation, temperature, strain, or suchlike and any combination thereof). In some embodiments the active element comprises at least one transducer element, such as, but not limited to, a sensor, a microelectromechanical system (MEMS) sensor, electromagnetic radiation emitter or receiver element, such as, but not limited to, an antenna, light emitting diode and/or laser diode, light detector, or suchlike and any combination thereof. Optionally, the active element comprises a MEMS.

The inventors hereof developed techniques for embedding active elements in ICs during wafer level fabrication stages without enclosing the active elements under capping element(s). The ICs can be constructed using wire bonding to couple a plurality of interfacing dies to an interposer wafer e.g., in a wafer-level-packaging process, whereby a base wafer structure is obtained. The interfacing dies are configured to interface between the active elements and the interposer wafer. The interposer wafer can have electrical contacts (e.g., pads), circuitries, conductors, through-silicon-vias (TSV), and/or contactors (e.g., ball grid array—BGA), generally referred to herein as electrical contact elements, configured for electrically coupling between the interfacing dies and external circuitry or systems/equipment. A cap wafer can be constructed by connecting and electrically coupling (e.g., by a wafer-to-wafer bonding process) a wafer of active elements to an intermediating wafer comprising conductors, vias, and optional circuitries, configured for electrically coupling between one or more of the active elements and the interfacing dies of the base wafer structure. The cap wafer structure is then attached and electrically connected (e.g., by a wafer-to-wafer bonding process) to the base wafer structure by attaching the intermediating wafer of the cap wafer structure to the interfacing dies of the base wafer structure.

The final multilayered wafer structure obtained can be then diced to singulate separate chip devices, each having one or more of the active elements operably ready for use. One or more arrays of the diced chip devices can be integrated onto circuit boards to form tiles of the diced chip devices, each tile of chip devices can be attached to a respective chassis, thereby providing improved heat dispersion capabilities (due to vertical heat distribution of the layered structure obtained) and facilitating simplified planar tiles mosaicking architectures of the singulated chips.

One inventive aspect of the subject matter disclosed herein relates to an integrated circuit assembly comprising base attached to a cap structures, the base structure comprising an interposer board and a plurality of interfacing dies electrically coupled to the interposer board, and the cap structure comprising an intermediating board and a panel of active elements having a plurality of active elements electrically coupled to the intermediating board. The cap structure is attached to said base structure such that each one of the plurality of active elements is electrically coupled to at least one of the plurality of interfacing dies. Optionally, but in some embodiments preferably, the integrated circuit comprises a plurality of electric wiring and/or contact means placed between the interfacing dies and the interposer board. The interposer board comprises in some embodiments a plurality of electrical contactors on a first side thereof. The electrical contact elements can be configured to electrically couple between the plurality of electrical contactors and the interfacing dies.

The interposer board can comprise a plurality of regions defined on a second side thereof. Each one of these regions can be configured to receive one a group of the plurality of interfacing dies therein. Each one of the groups of the interfacing dies is associated in some embodiments with a respective group of one or more of the active elements of the panel of active elements. Each group of the interfacing dies can be set to comprise an operating component configured to operate at least one of the active elements of the respective group of active elements. At least one control module configured to control operation of the operating components the group can be used in each group of the interfacing dies. Optionally, but in some embodiments preferably, a main control unit is used to control the operation of the control modules of the groups of interfacing dies. Optionally. Each group of the active elements is implemented by a 2×2 array of active elements.

The intermediating board comprises in some embodiments a plurality of coupling components configured to electrical couple each one of the plurality of active elements with one of the plurality of interfacing dies. Optionally, the interposer board is implemented in an interposer wafer. The plurality of interfacing dies can be electrically coupled to the interposer wafer by wire bonding.

The intermediating board is implemented in some embodiments in an intermediating wafer. The panel of transducing active elements can be implemented in a wafer of transducing active elements. In some embodiments the intermediating board is connected to the panel of transducing active elements by a wafer-to-wafer bonding. The cap structure can be attached to the base structure by wafer-to-wafer bonding.

Optionally, but in some embodiments preferably, each one of the plurality active elements comprises at least one of the following: an optical sensor, a cavity sensor, a fluidic sensor, a strain sensor, an inductive and/or capacitive sensor, electric resistance and/or conductivity sensor, velocity sensor, acceleration sensor, orientation sensor, a microelectromechanical system (MEMS) sensor, and/or an antenna. In some embodiments the panel of active elements comprises a 4×4 array of active elements.

Another inventive aspect of the subject matter disclosed herein related to a tile of a plurality of the integrated circuits described hereinabove and/or hereinbelow. The tile of integrated circuits comprises a backend circuit board configured to attach to the plurality of integrated circuits and to provide electrical connectivity between the plurality of integrated circuits, and a chassis configured to attach to and support the backend circuit board with the plurality of integrated circuits attached thereto. The tile comprises in some embodiments a 2×2 array of the integrated circuits. The chassis can be configured to dissipate heat produced by the integrated circuits of the tile during operation. The tile can comprise connections for power supply lines, for control signals lines, and for concatenation lines.

Another inventive aspect of the subject matter disclosed herein related to an array of a plurality of the tiles described hereinabove and/or hereinbelow. Each one of the plurality of tile of the array is in cascade connection with at least another one of the plurality of tiles via the connections concatenation lines.

Yet another inventive aspect of the subject matter disclosed herein relates to a method of constructing and integrated circuit assembly. The method comprising electrically coupling a plurality of interfacing dies to an interposer wafer to thereby provide a base wafer of the integrated circuit assembly, the interposer wafer configured to provide connectivity to the plurality of interfacing dies, electrically coupling a wafer of active elements having a plurality of active elements to an intermediating wafer to thereby provide a cap wafer of the integrated circuit assembly, the intermediating wafer configured to provide connectivity to the plurality of active elements, and attaching the cap wafer to the base wafer such that each one of said plurality of active elements is electrically coupled to at least one of the plurality of interfacing dies.

The electrically coupling of the plurality of interfacing dies comprises in some embodiments placing a plurality of electric wiring and/or contact means between the interfacing dies and the interposer wafer. The attaching of the cap wafer to the base wafer can comprise dicing the cap structure to singulate a plurality of cap structure, and attaching each of the plurality of cap structure to a respective region on the base wafer.

The method comprises in some embodiments defining a plurality of regions in the interposer wafer. The electrically coupling of the plurality of interfacing dies can thus comprise placing in each one of the regions a group of the plurality of interfacing dies. The method comprises in some embodiments associating each one of the groups of the interfacing dies with a respective group of one or more of the active elements of the wafer of active elements. The electrically coupling of the plurality of interfacing dies can comprise connecting an operating component configured to operate at least one of the active elements of the respective group of active elements. The electrically coupling of the plurality of interfacing dies can comprise connecting for each group of the interfacing dies at least one control module configured to control operation of the operating components the group. Optionally, the electrically coupling of the plurality of interfacing dies comprises connecting a main control unit configured to control the operation of the control modules of the groups of interfacing dies.

In some embodiment the electrically coupling of the plurality of interfacing dies comprises wire bonding. The electrically coupling of the wafer of active elements comprises in some embodiments wafer-to-wafer bonding. The attaching of the cap wafer to the base structure cap structure can be carried out by wafer-to-wafer bonding.

Another inventive aspect of the subject matter disclosed herein relates to a method of constructing a tile of a plurality of the integrated circuits described hereinabove and/or hereinbelow. The method comprising attaching the plurality of integrated circuits to a backend circuit board configured to provide electrical connectivity between the plurality of integrated circuits, and attaching the backend circuit board with the plurality of integrated circuits attached thereto to a supporting chassis.

Yet another inventive aspect of the subject matter disclosed herein relates to a method of constructing an array of a plurality of the tiles disclosed hereinabove and/or hereinbelow. The method comprising connecting each one of the plurality of tile in cascade connection to at least another one of said plurality of tiles.

BRIEF DESCRIPTION OF THE DRAWINGS

In order to understand the invention and to see how it may be carried out in practice, embodiments will now be described, by way of non-limiting example only, with reference to the accompanying drawings. Features shown in the drawings are meant to be illustrative of only some embodiments of the invention, unless otherwise implicitly indicated. In the drawings like reference numerals are used to indicate corresponding parts, and in which:

FIGS. 1A to 1C schematically illustrate construction of an integrated circuit with embedded sensor elements according to some possible embodiments, wherein FIG. 1A illustrates construction of base and cap wafer structures of the integrated circuit, FIG. 1B illustrates base and cap wafer structures of the integrated circuit, and FIG. 1C shows the integrated circuit after the base and cap wafer structures are coupled one to the other;

FIGS. 2A to 2C schematically illustrate a process of construction of an integrated circuit with embedded sensor elements according to some possible embodiments, wherein FIG. 2A shows the layers of the integrated circuit, FIG. 2B shows a perspective view of a top side of the integrated circuit, and FIG. 2C shows a perspective view of a bottom side of the integrated circuit;

FIGS. 4A and 4B schematically illustrate a process of construction of an integrated circuit with embedded sensor elements according to some possible embodiments, wherein FIG. 4A shows a top perspective view of the layers of the integrated circuit, and FIG. 4B shows a bottom perspective view of the layers of the integrated circuit;

FIGS. 5A to 5F schematically illustrate a possible wafer level production process according to some possible embodiments, wherein FIG. 5A shows a perspective view of an interposer wafer substrate, FIG. 5B shows a perspective view of a base wafer substrate structure comprised of the interposer wafer substrate with interfacing dies attached thereto, FIG. 5C shows a perspective view of the base wafer substrate structure and a cap wafer substrates structure before attaching and electrically coupling them, FIG. 5D shows the base and cap wafer substrates structures after attaching and electrically coupling them to obtain a multi-layered wafer structure, FIG. 5E shows a perspective view of the multilayered wafer structure after it is diced to singulate chip devices, and FIG. 5F shows a possible chip construction technique wherein the cap wafer substrate structure is diced before attaching and electrically coupling to base wafer substrate structure;

FIGS. 8A and 8B schematically illustrate an assembly of four arrays of the integrated circuits having embedded sensor elements, wherein FIG. 8A is a back perspective view of the assembly and FIG. 8B is a front perspective view of the assembly; and FIGS. 9A and 9B schematically illustrate an assembly of eight arrays of the integrated circuits having embedded sensor elements, wherein FIG. 9A is a back perspective view of the assembly and FIG. 9B is a front perspective view of the assembly.

DETAILED DESCRIPTION OF EMBODIMENTS

Figure 2B:
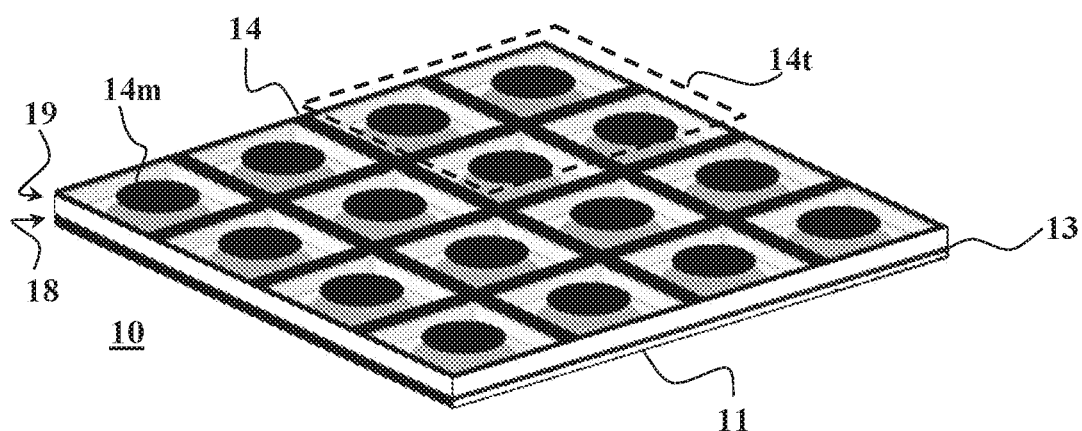

One or more specific embodiments of the present disclosure will be described below with reference to the drawings, which are to be considered in all aspects as illustrative only and not restrictive in any manner In an effort to provide a concise description of these embodiments, not all features of an actual implementation are described in the specification. Elements illustrated in the drawings are not necessarily to scale, or in correct proportional relationships, which are not critical. Emphasis instead being placed upon clearly illustrating the principles of the invention such that persons skilled in the art will be able to make and use the integrate circuitry structures hereof, once they understand the principles of the subject matter disclosed herein. This invention may be provided in other specific forms and embodiments without departing from the essential characteristics described herein.

The present application discloses integrated circuits having embedded transducer elements or generally active/functional elements, or sensors), and methods of fabricating thereof. Semiconductor chip devices of possible embodiments are constructed from a base wafer structure having an interposer wafer and a plurality of interfacing dies (intended to interface transducers and/or active/functional elements) electrically coupled thereto, said interposer wafer configured to electrically couple between the interfacing dies and external circuitry and/or systems/equipment (e.g., via electrical contacts thereof, such as BGA), and a cap wafer structure having a wafer of transducer elements electrically coupled to an intermediating wafer configured to electrically couple between the wafer of transducer elements and the interfacing dies of the base wafer structure. The base wafer and the cap wafer can be electrically coupled one to the other by a wafer-to-wafer bonding.

More particularly, the interfacing dies are mounted on the interposer wafer of the base wafer structure, the wafer of transducer elements is mounted on the intermediating wafer of the cap wafer structure, and the cap wafer structure is mounted on the base wafer structure. This way, a multilayered wafer structure is obtained wherein the wafer of transducer elements is the topmost layer, and the interposer wafer is the bottommost layer, and the intermediating wafer and the interfacing dies are sandwiched therebetween one on top the other. The intermediating wafer is configured to interconnect each of the interfacing dies to a respective group of one or more of the transducer elements of the wafer of transducer elements, and the interposer wafer connects between each of the interfacing dies and a respective group of its electrical contacts, such that a top to bottom signal propagation path is obtained.

In some embodiments the base wafer structure is prepared by a wafer-level-packaging process used for attaching and electrically coupling (e.g., by wire bonding) the plurality of interfacing dies to the interposer wafer. The interposer wafer comprises in some embodiments electrical contact elements (e.g., pads), circuitries, electrically conducting lines, and/or vias (e.g., through-silicon-vias—TSV), generally referred to herein as electrical contact elements, configured to electrically connect between the interfacing dies and the external systems/equipment. The cap wafer structure can be prepared by wafer-to-wafer bonding used for connecting and electrically coupling the wafer of transducer elements to the intermediating wafer. The intermediating wafer comprises in some embodiments electrical contacts (e.g., pads), conductors, vias (e.g., TSV), and/or circuitries, generally referred to herein as electrical contact elements, configured for electrically connecting one or more of the transducer elements to the interfacing dies of the base wafer structure.

A wafer-to-wafer bonding process can be used in some embodiments to attach and electrically connect the cap wafer structure to the base wafer structure by attaching the intermediating wafer of the cap wafer structure to the interfacing dies of the base wafer structure. The final wafer structure obtained can be then diced to singulate separate chip devices, each having one or more transducer elements operably ready for use. One or more arrays of the diced chip devices can be integrated onto circuit boards to form tiles of the diced chip devices. Each tile of the chip devices can be attached to a respective heat dispersive chassis, thereby providing improved heat dispersion capabilities (due to vertical heat distribution of the layered structure obtained) and facilitating simplified planar tiles mosaicking architectures.

For an overview of several example features, process stages, and principles of the invention, the multilayered integrated circuits examples illustrated schematically and diagrammatically in the figures are generally intended for integration of transducer elements. These integrated circuits are shown as one example implementation that demonstrates a number of features, processes, and principles used to provide simplified techniques for embedding transducer elements in integrated circuits, but they are also useful for other applications and can be made in different variations. Therefore, this description will proceed with reference to the shown examples, but with the understanding that the invention recited in the claims below can also be implemented in myriad other ways, once the principles are understood from the descriptions, explanations, and drawings herein. All such variations, as well as any other modifications apparent to one of ordinary skill in the art and useful in integrated circuits applications may be suitably employed, and are intended to fall within the scope of this disclosure.

FIGS. 1A to 1C schematically illustrate construction of an integrated circuit 10 according to some possible embodiments. FIG. 1A schematically illustrates the integrated circuit 10 can be constructed from an interposer wafer 11, a plurality of interfacing dies 12 configured to be received in regions 11g of the interfacing wafer and electrically connect to conductors 11i of the interposer wafer 11, an intermediating wafer 13 configured to electrically connect to electrical contacts 12r (e.g., contact pads) of the interfacing dies 12, and a wafer of transducer elements 14 having a plurality of transducer elements 14m configured to electrically connect to electrical contacts 13r (e.g., contact pads) of the intermediating wafer 13.

The interposer wafer 11 is configured to electrically couple between the interfacing dies 12 and external circuitry/systems (not shown). In some embodiments the interposer wafer 11 comprises a plurality of electrical contacts 11r (e.g., BGA) arranged over a bottom face thereof, and its electrical conductors 11i are configured to electrically connect between the interfacing dies 12 and its electrical contacts 11r. The interposer wafer 11 may have depressions (11g) and/or partitioning elements 11p configured to define the regions 11g in which the interfacing dies 12 are received.

FIG. 1B schematically illustrates construction of a base wafer structure 18 by attaching and electrically coupling the interfacing dies 12 to the interposer wafer 11 e.g., by wafer-level-packaging, and construction of a cap wafer structure 19 by attaching and electrically coupling the wafer of transducer elements 14 to the intermediating wafer 13 e.g., by wafer-to-wafer bonding. FIG. 1C schematically illustrates construction of the integrated circuit structure 10 by attaching and electrically coupling the cap wafer structure 19 to the base wafer structure 18 e.g., by wafer-to-wafer bonding.

FIG. 2A schematically illustrates technique for construction of the integrated circuit structure 10 and embedding the transducer elements 14m therein. As seen, the integrated circuit structure 10 comprises the base wafer structure 18, and the cap wafer structure 19 configured for mounting on and electrically couple to the base wafer structure 18. The base wafer structure 18 comprises the interposer wafer 11 having the plurality of electrical contacts (11r), and it is configured to receive and electrically connect between the plurality of interfacing dies 12 and its electrical contacts (11r). The cap wafer structure 19 comprises the wafer of transducer elements 14, and the intermediating wafer 13 configured to electrically couple each one of the interfacing dies 12 of the base structure wafer 18 with a respective group 14t of one or more transducer elements 14m of the wafer of transducer elements 14.

The interfacing dies 12 are configured to operate the group 14t of one or more transducer elements 14m of the integrated circuit structure 10. For example, and without being limiting, the interfacing dies 12 can be configured to drive the respective group of transducer elements 14t electrically coupled thereto, receive, and if so needed process (e.g., amplify and/or filter and/or modulate/demodulate), signals generated by the transducer elements 14m of its group 14t of transducer elements, and utilize the connectivity provided by the interposer wafer to communicate the signals to external system/circuitry (not shown) via the electrical contacts (11r). Optionally, but in some embodiments preferably, the interfacing dies 12 are further configured to receive signals from an external system/circuitry electrically connected to the electrical contacts (11r) of the interposer wafer 11, if so needed process (e.g., amplify and/or filter and/or modulate/demodulate) the received signals, and transfer the same to the transducer elements 14m of the group 14t of transducer elements 14m electrically coupled thereto.

In some embodiments the interfacing dies 12 associated with each group 14t of transducer elements 14m comprise a plurality of transducer operating components 12m and at least one control module 12c configured to control operation of the respective transducer operating components 12m. In this non-limiting example the interposer wafer 11 is partitioned into a number of separate sections 11t defined by the partitioning elements 11p, wherein each separate section 11t is associated with a respective group 14t of the transducer elements 14m and configured to receive and electrically couple to the respective interfacing dies 12 of the respective group 14t of transducer elements 14m. Optionally, but in some embodiments preferably, the partitioning elements 11*p* are configured to define a central region 11*c* in which the at least one control module 12*c* is received such that it is surrounded by the transducer operating components 12*m* of the respective group 14*t* of transducer elements 14*m*.

The interposer wafer 11 is accordingly configured to provide the connectivity required between each control module 12*c* and its respective transducer operating components 12*m* e.g., through electrically conducting lines (11*i*) and/or vias (not shown) if so needed. Alternatively, or additionally, the intermediating wafer 13 is configured to provide the connectivity required between each control module 12*c* and its respective transducer operating components 12*m*.

Particularly, the interposer wafer 11 in this specific and non-limiting example is partitioned into four distinct sections 11*t*, each configured to receive and electrically couple interfacing dies 12 electrically coupled to a respective group of transducer elements 14*t* of the wafer of transducer elements 14. The interposer wafer 11 may further comprise circuitries (not shown), electrically conducting lines (11*i*), and/or vias (not shown), configured to electrically couple between its electrical contacts (11*r*), and the interfacing dies.

As seen in FIG. 2A, in this specific and non-limiting example the wafer of transducer elements 14 comprises an array of sixteen (16) transducer elements 14*m* arranged in four (4) groups 14*t* of transducer elements 14*m*, and each group 14*t* of transducer elements 14*m* comprises four (4) transducer elements 14*m* of the wafer of transducer elements 14. The intermediating wafer 13 comprises for each transducer element 14*m* of the wafer of transducer elements 14 a respective transducer coupling element 13*u* configured to provide electrical connectivity between the transducer element 14*m* and its respective transducer operating components 12*m*.

This way, a top to bottom signal propagation scheme is obtained, whereby signals generated by each of the transducer elements 14*m* located in the top layer of the integrated circuit structure are passed by the respective transducer coupling element 13*u* of the intermediating wafer 13 to a respective transducer operating components 12*m* of the interfacing dies 12, and therefrom transferred after it is optionally thereby processed via the interposer wafer 11 to the electrical contacts (11*r*) located on a bottom side of the bottommost layer of the integrated circuit structure 10.

A bottom to top signal propagation scheme can be similarly obtained as signals received via the electrical contacts (11*r*) of the bottommost interposer wafer 11 layer are thereby passed to the transducer operating components 12*m* of the interfacing dies 12, wherefrom they are transferred after being optionally thereby processed to the transducer coupling components 13*u* of the intermediating wafer 13 and therefrom to the respective transducer elements 14*m* of the topmost wafer of transducer elements 14 layer of the integrated circuit structure 10.

Optionally, but in some embodiments preferably, the signals received via the electrical contacts (11*r*) of the interposer wafer 11 comprise control and/or data signals passed by the interposer wafer 11 to the control modules 12*c* of the interfacing dies 12 for tuning and/or configuring the operation of the transducer operating components 12*m*. Alternatively, or additionally, control and/or data signals can be received by the transducer elements 14*m* (e.g., utilizing antenna elements comprised therein) and therefrom transferred via the transducer coupling components 13*u* of the intermediating wafer 13 to the transducer operating components 12*m*, which optionally process the received signals and pass the same to the respective control module 12*c*.

The interposer wafer 11, the interfacing dies 12, the intermediating wafer 13, and/or the wafer of transducer elements 14 can be manufactured using any suitable conventional and/or upcoming wafer production technology. For example, but without being limiting, these wafer/dies can be manufactured by semiconductor wafer production technologies known in the art e.g., Silicon, Silicon-Germanium, Gallium-Arsenide, Gallium-Nitride, or combinations thereof, as used nowadays. The wafer of transducer elements may comprise any type and any number of suitable transducer elements 14*m*, per application requirements and wafer production technology utilized. For example, but without being limiting, each transducer element 14*m* may comprise an optical sensor, a cavity sensor, a fluidic sensor, a strain sensor, an inductive and/or capacitive sensor, electric resistance and/or conductivity sensor, velocity sensor, acceleration sensor, orientation sensor, a microelectromechanical system (MEMS) sensor, and/or an antenna. Optionally, the wafer of transducer elements 14 comprises MEMS.

The interfacing dies 12 can be connected and electrically coupled to the interposer wafer 11 utilizing wire bonding techniques, for example, by a wafer-level-packaging process configured to produce the base wafer structure 18. The wafer of transducer elements 14 can be connected and electrically coupled to the intermediating wafer 13 by a wafer-to-wafer bonding process configured to produce the cap wafer structure 19. The cap wafer structure 19 can be connected and electrically coupled to the base wafer structure 18 by wafer-to-wafer bonding process configured to provide the final multilayered integrated circuit wafer structure 10.

Figure 2C:
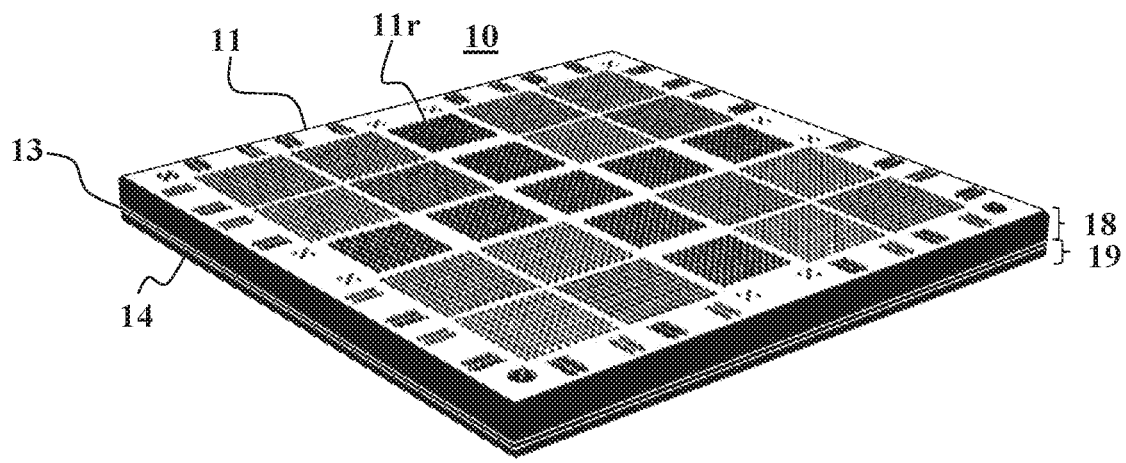

FIG. 2B shows a perspective view of the upper side of the integrated circuit structure 10 obtained after the cap wafer structure 19 is connected and electrically coupled to the base wafer structure 18. FIG. 2C shows a perspective view of the bottom side of the integrated circuit structure 10 obtained after the cap wafer structure 19 is connected and electrically coupled to the base wafer structure 18. The integrated circuit structure 10 can be diced to singulate therefrom transducer/sensor chips comprising one or more of the transducer elements 14*m*.

Figures 3A, 3B:
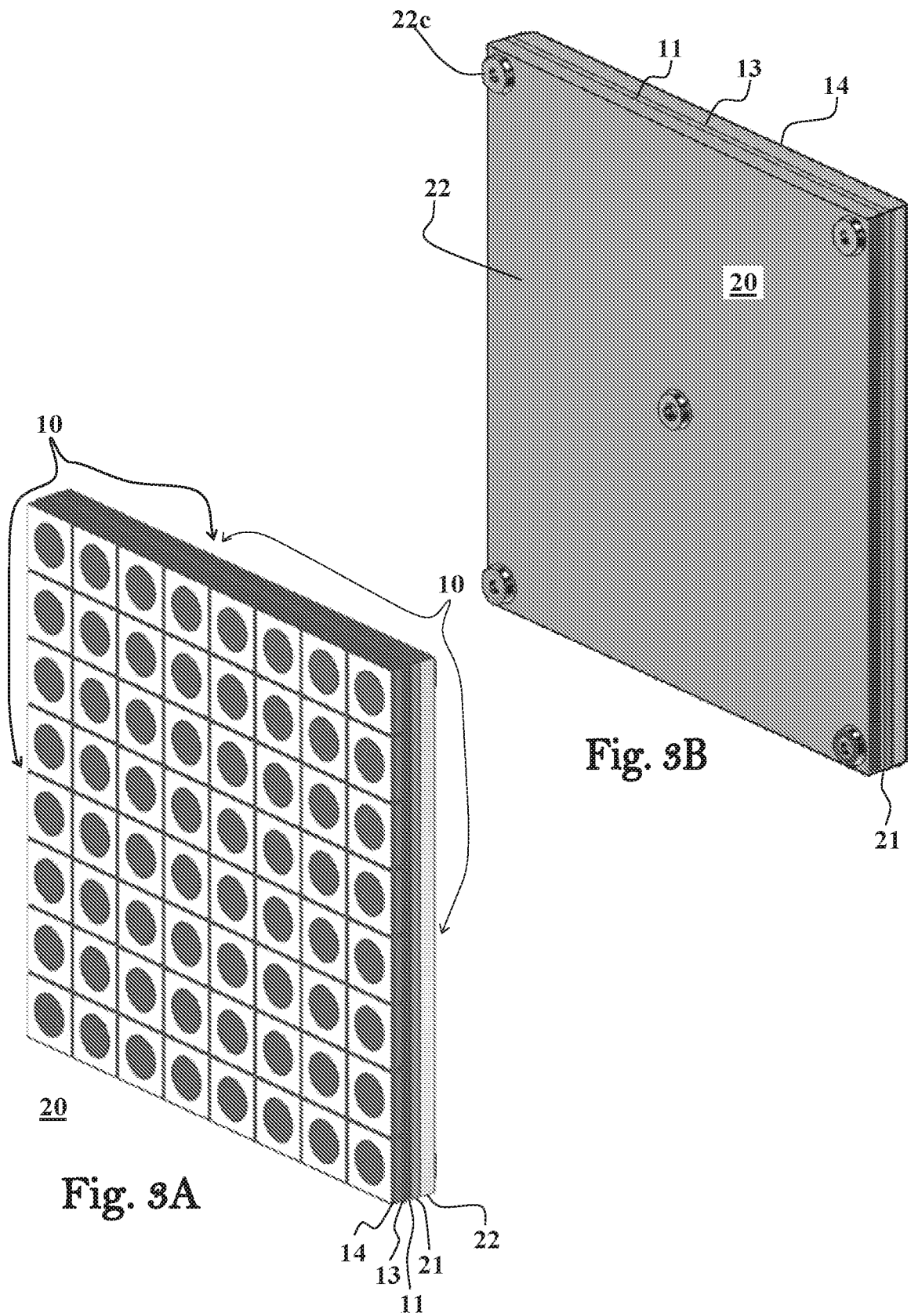
FIGS. 3A and FIG. 3B schematically illustrate an array of the integrated circuits combined according to some possible embodiments to form a tile of sensor elements.

FIGS. 3A and 3B respectively show perspective front and rear views of an array 20 of the integrated circuit structures 10 connected and electrically coupled to a backend circuit board 21 attached to a chassis element 22 having one or more supporting projections 22*c*. Optionally, but in some embodiments preferably, the chassis element 22 is made from materials having high thermal conductivity (e.g., aluminum, copper, aluminum plate with embedded heat pipes, vapor chamber, light weight vapor chamber) configured to dissipate heat developed in the integrated circuit structures 10 during their operation and transfer it to the environment and/or to heat transfer media (e.g., air or other fluid) thermally coupled thereto. In this specific and non-limiting example the array 20 is implemented by a 2×2 array i.e., having a total of four (4) integrated circuit structures 10, each of which having an array of 4×4 i.e., comprising sixteen (16), embedded transducer elements 14*m*. This way, a tile having an 8×8 i.e., comprising sixty four (64), embedded transducer elements 14*m* is obtained.

Figure 4A:
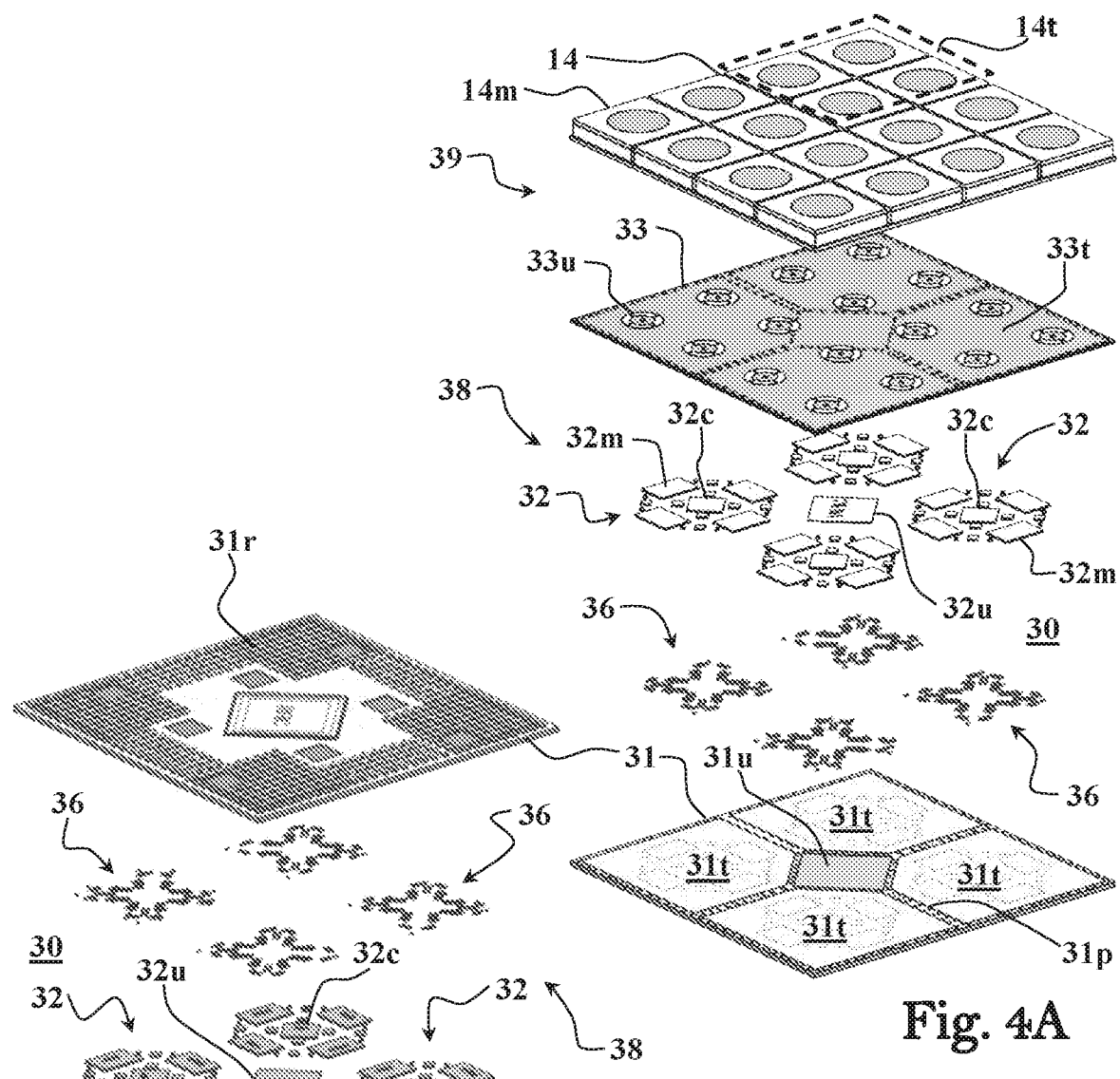
Figure 4B:
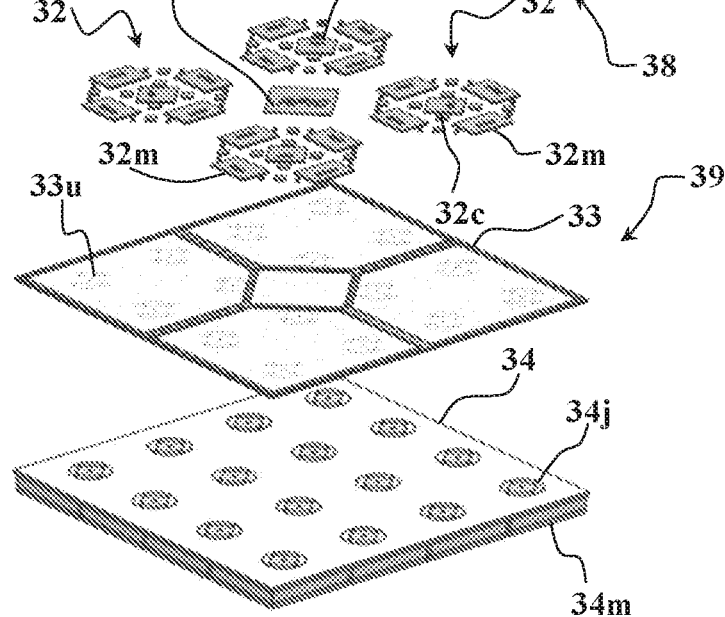

FIGS. 4A and 4B respectively show upper and bottom side views of layers of an integrated circuit structure 30, and schematically illustrating construction thereof. The integrated circuit structure 30 is assembled from a base wafer structure 38 and a cap wafer structure 39, separately constructed and thereafter connected and electrically coupled one to the other. The base wafer structure 38 comprises an interposer wafer 31 having a plurality of interfacing dies 32 interconnected thereto by electric wiring and/or contact means 36 e.g., implemented by ball-bonds, wire-bonds, wedge-bonds, or soldered flip-chipped to the interposer wafer. The cap wafer structure 39 comprises a wafer of transducer elements 14 having a plurality of transducer elements 14*m* and an intermediating wafer 33 attached and electrically coupled to the wafer of transducer elements 14 and configured to provide electrical connectivity between the transducer elements 14*m* and the interfacing dies 32.

The intermediating wafer 33 is configured to electrically couple each one of the interfacing dies 32 of the base wafer structure 38 with a respective group 14*t* of one or more transducer elements 14*m* of the wafer of transducer elements 14. The interfacing dies 32 are configured to operate the group 14*t* of the one or more transducer elements 14*m* of the integrated circuit structure 30. For example, and without being limiting, the interfacing dies 12 can be configured to drive the respective group of transducer elements 14*t* electrically coupled thereto, receive, and if so needed process (e.g., amplify and/or filter and/or modulate) signals generated by the transducer elements 14*m* of its group 14*t* of transducer elements, and utilize the connectivity provided by the interposer wafer to communicate the received signals to external system/circuitry (not shown) via the electrical contacts 31*r*. Optionally, but in some embodiments preferably, the interfacing dies 32 are configured to receive signals from an external system/circuitry electrically connected to electrical contacts 31*r* of the interposer wafer 31, if so needed process (e.g., amplify and/or filter and/or modulate/demodulate) the received signals, and transfer the same to the transducer elements 14*m* of the group 14*t* of transducer elements electrically coupled thereto.

In some embodiments the interfacing dies 32 associated with each group 14*t* of the transducer elements 14*m* comprise a plurality of transducer operating components 32*m* and at least one control module 32*c* configured to control operation of the respective transducer operating components 32*m*. In this non-limiting example the interposer wafer 31 is partitioned into a number of separate sections 31*t*, each associated with a respective group 14*t* of the transducer elements 14*m* and configured to receive and electrically couple to the respective interfacing dies 32 of the sections 11*t*. A main control unit 32*u* can be used to control the operation of the control module 32*c* of each one of the group 14*t* of the transducer elements 14*m* and thereby orchestrate the operation of the entire chip device 30.

The interposer wafer 31 can be configured to provide electrical connectivity between each control module 32*c* and its respective transducer operating components 32*m*, and optionally also between the main control unit 32*u* and the control modules 32*c* of the different groups 14*t* of transducer elements 14*m* e.g., through electrically conducting lines (11*i*) and/or vias (not shown), if so needed. Alternatively, or additionally, the intermediating wafer 33 is configured to provide the connectivity required between each control module 32*c* and its respective transducer operating components 32*m*, and optionally also between the main control unit 32*u* and the control modules 32*c* of the different groups 14*t* of transducer elements 14*m*.

The interposer wafer 31 in this specific and non-limiting example is partitioned by partitioning elements 31*p* into four distinct sections 31*t*, each configured to receive and electrically couple interfacing dies 32 electrically coupled to a respective group of transducer elements 14*t* of the wafer of transducer elements 14. A central portion 31*u* of the interposer wafer 31, optionally also defined by the partitioning elements 31*p*, is configured to connect and electrically coupled to the main control unit 32*u*. The interposer wafer 31 may further comprise circuitries (not shown), electrically conducting lines (11*i*), and/or through-vias (not shown), configured to electrically couple between its electrical contacts 31*r*, and the interfacing dies 32.

In this specific and non-limiting example the wafer of transducer elements 14 comprises a 4×4 array of sixteen (16) transducer elements 14*m* arranged in a 2×2 array of four (4) groups 14*t* of transducer elements 14*m*, and each group 14*t* of the transducer elements comprises a 2×2 array of four (4) transducer elements 14*m* of the wafer of transducer elements 14. The intermediating wafer 33 comprises for each transducer element 14*m* of the wafer of transducer elements 14 a respective transducer coupling element 33*u* configured to provide electrical connectivity between the transducer element 14*m* and its respective transducer operating components 32*m*. Optionally, the intermediating wafer 33 is partitioned into sections 33*t* corresponding to the separate sections 31*t* of the interposer wafer 31, section 33*t* configured to accommodate the transducer coupling components 33*u* of the respective group 14*t* of the transducer elements 14*m* associated with separate section 31*t* of the interposer wafer 31.

This integrated circuit configuration 30 can be similarly used to implement a top to bottom signal propagation scheme, or a bottom to top signal propagation scheme, as described in details hereinabove with reference to FIGS. 1A to 1C. Optionally, but in some embodiments preferably, the signals received via the electrical contacts 31*r* of the interposer wafer 31 comprise control and/or data signals passed by the interposer wafer 31 to the control modules 32*c* of the interfacing dies 32, and/or to the main control units 32*u*, for tuning and/or configuring the operation of the transducer operating components 32*m*. Alternatively, or additionally, control and/or data signals are received by the transducer elements 14*m* (e.g., utilizing antenna elements comprised therein) and therefrom transferred via the transducer coupling components 33*u* of the intermediating wafer 33 to the transducer operating components 32*m*, which optionally process the received signals and pass the same to the respective control module 32*c*, and/or to the main control units 32*u*.

The interposer wafer 31, the interfacing dies 32, the intermediating wafer 33, and/or the wafer of transducer elements 14 can be manufactured using any suitable conventional and/or upcoming wafer production technology. For example, but without being limiting, these wafers/dies can be manufactured by semiconductor wafer production technologies known in the art e.g., Silicon, Silicon-Germanium, Gallium-Arsenide, Gallium-Nitride, or combinations thereof. The electric wiring and/or contact means 36 can be implemented by wire-bonds, ball bonds, wedge bond, or by flip chipped soldered to the interposer wafer.

The wafer of transducer elements may comprise any type and any number of suitable transducer elements 14*m*, per application requirements and wafer production technology utilized. For example, but without being limiting, each transducer element 14*m* may comprise an optical sensor, a cavity sensor, a fluidic sensor, a strain sensor, an inductive and/or capacitive sensor, electric resistance and/or conductivity sensor, velocity sensor, acceleration sensor, orientation sensor, a microelectromechanical system (MEMS) sensor, and/or an antenna. Optionally, the wafer of transducer elements 14 comprises MEMS.

The interfacing dies 32 can be connected and electrically coupled to the interposer wafer 31 utilizing wire bonding techniques, for example, by a wafer-level-packaging process configured to produce the base wafer structure 38. The wafer of transducer elements 14 can be connected and electrically coupled to the intermediating wafer 33 by a wafer-to-wafer bonding process configured to produce the cap wafer structure 39. The cap wafer structure 39 can be connected and electrically coupled to the base wafer structure 38 by wafer-to-wafer bonding process configured to provide the final multilayered integrated circuit wafer structure 30.

Figure 5A:
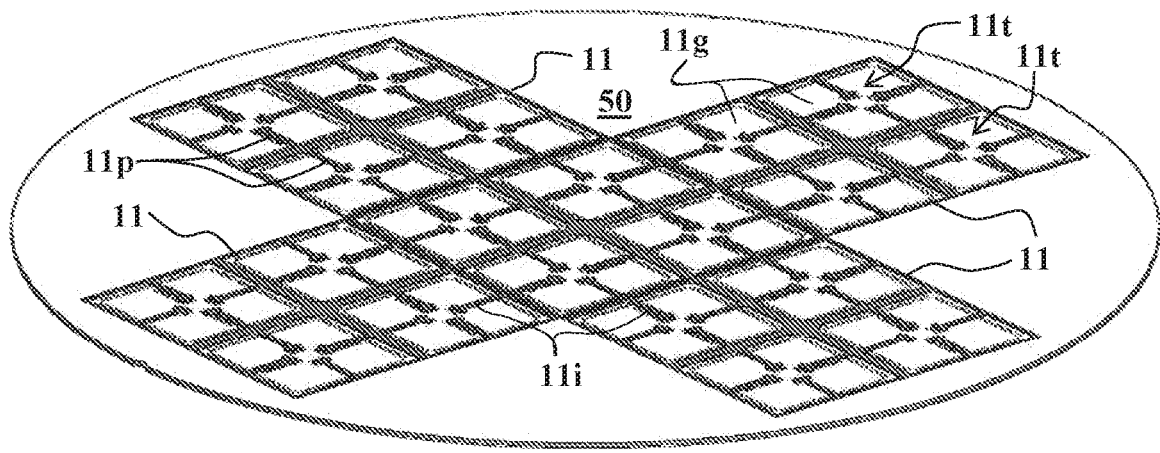
Figure 5B:
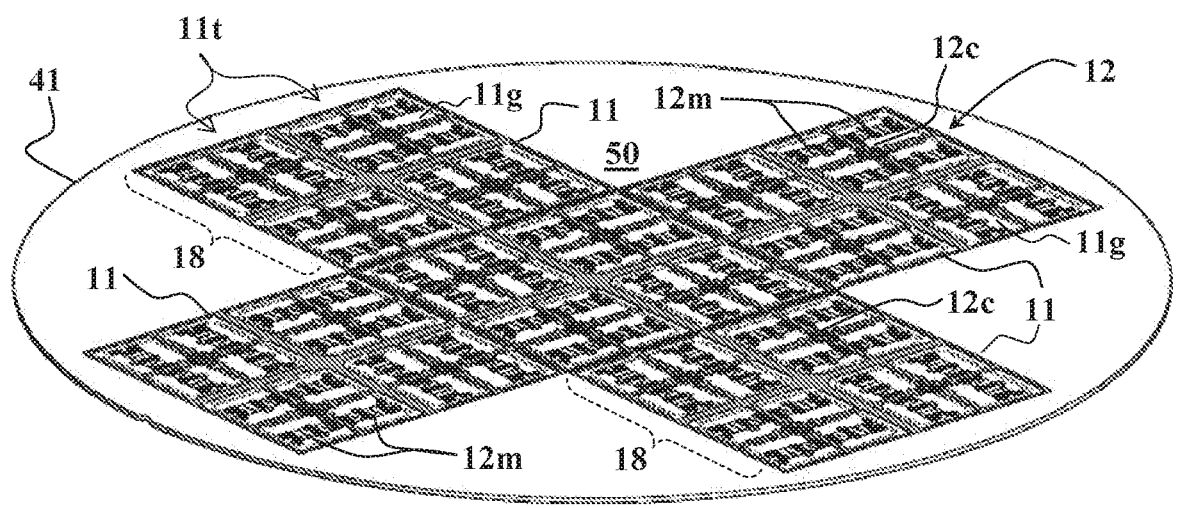

FIGS. 5A to 5D demonstrate a wafer level production technique for embedding transducer elements 14m in semiconductor chips. FIGS. 5A and 5B shows construction of a plurality of base wafer structures 18 on an interposer wafer substrate 50. The interposer wafer substrate 50 can be manufactured utilizing conventional and/or upcoming semiconductor wafer production techniques (e.g., as mentioned hereinabove) to form a plurality of interposer wafer portions 11. Each interposer wafer portion 11 comprises a plurality of separate sections 11t, each associated with a respective group of transducer elements 14m. Each separate section 11t of the interposer wafer portion 11 comprises partitioning elements 11p configured to define the regions 11g in which the interfacing dies 12 are to be received.

FIG. 5B shows the interposer wafer substrate 50 with the interfacing dies 12 placed in their respective regions 11g in each of the sections 11t of the plurality of interposer wafer portions 11, and electrically coupled to the interposer wafer substrate 50 to establish electrical connectivity with the electrical contacts (11r e.g., BGA) of the interposer wafer portions 11. This way, a plurality of base wafer structures 18 are formed in a single interposer wafer substrate 50, thereby forming a base wafer substrate structure 41.

In this specific and non-limiting example five (5) base wafer structures 18 are formed in the interposer wafer substrate 50. Each base wafer structure 18 is formed in a respective interposer wafer portion 11 of the interposer wafer substrate 50, each interposer wafer portion 11 having four (4) separate sections 11t, wherein each separate section 11t comprises four (4) regions 11g for placing and electrically coupling the interfacing dies 12 (or 32) therein. In some embodiments the interfacing dies 12 (or 32) are coupled to the interposer wafer substrate 50 by wire bonding techniques. The interfacing dies 12 (or 32) may comprise transducer operating components 12m (or 32m) and respective control modules 12c (or 32c) as described in details hereinabove with reference to FIGS. 2A to 2C (or FIGS. 4A and 4B).

In some possible embodiments the base wafer substrate structure 41 is constructed utilizing electric wiring and/or contact means (36), as described in details hereinabove with reference to FIGS. 4A and 4B. Similarly, the interfacing dies 12 may comprise a main control unit (32u) to control the operation of the control modules 12c.

In this specific and non-limiting example the interposer wafer substrate 50 is of circular shape and thus its five (5) base wafer structures 18 are arranged is a cross shape to maximize deployment of the substrate surface area. It is however noted that this construction technique is not limited to circular substrates, and that it may be similarly used with substrates having different shapes e.g., rectangular, triangular, polygonal, ellipsoid, etc. and with different arrangements of the base wafer structures 18 therein.

Figure 5C:
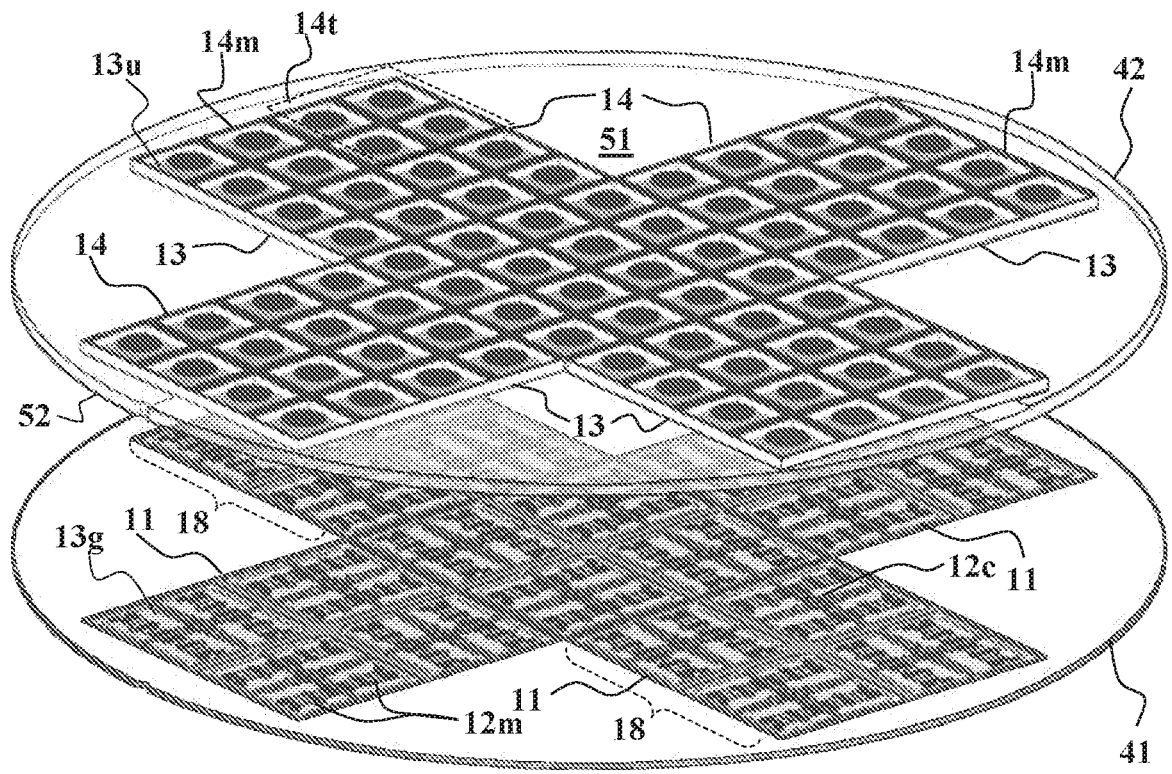
Figure 5D:
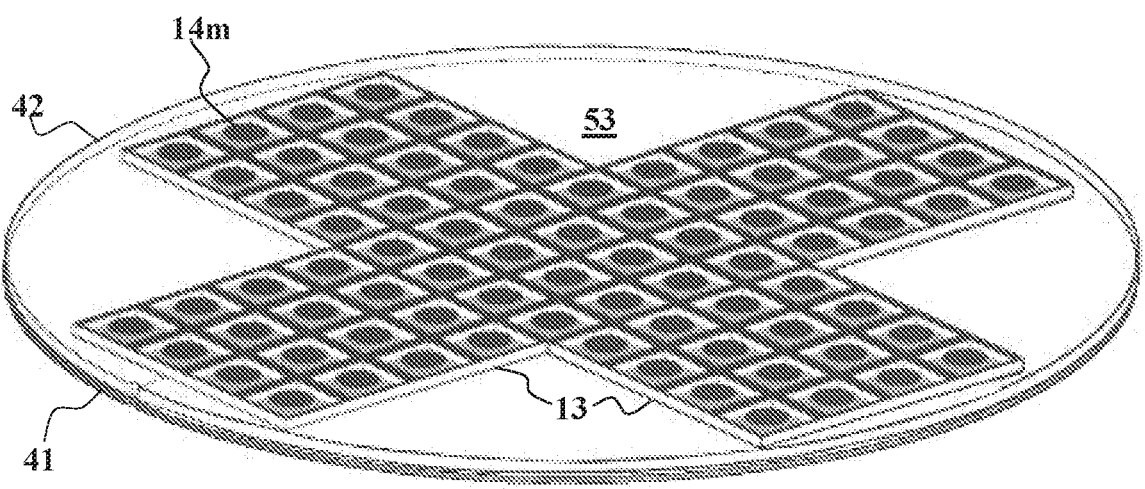

FIG. 5C demonstrates attachment of a cap wafer substrate structure 42 to the base wafer substrate structure 41. The cap wafer substrate structure 42 is comprised of a wafer substrate of transducer elements 51 having a plurality of transducer elements wafer portions 14 attached and electrically coupled to an intermediating wafer substrate 52 having a respective plurality of intermediating wafer portions 13. The configurations and functionalities of the transducer elements wafer portions 14, the intermediating wafer portions 13, and their components, are described in details hereinabove in reference to the intermediating and transducers' wafers 13 and 14 shown FIGS. 1 and 2, and thus will not be described again for brevity.

The transducer elements 14m of each transducer elements wafer portion 14 of the wafer substrate of transducer elements 51 can be arranged in groups 14t, and the transducer coupling elements 13u of each of the intermediating wafer portions 13 of the intermediating wafer substrate 52 can be configured to electrically connect each group 14t of the transducer elements 14m to a respective set of interfacing dies 12 operably positioned in a respective region 11g of the respective interposer wafer portion 11 of the interposer wafer substrate 50. This way, a top-to-bottom, and/or bottom-to-top, signal propagation paths can be achieved, as described hereinabove in details.

The wafer substrate of transducer elements 51 can be attached and electrically coupled to the intermediating wafer substrate 52 by wafer-to-wafer bonding. The cap wafer substrate structure 42 can be attached and electrically coupled to the base wafer substrate structure 41 by wafer-to-wafer bonding. The cap wafer substrate structure 42 can be attached and electrically coupled to the base wafer substrate structure 41 by wafer-to-wafer bonding techniques, to thereby produce the multilayered wafer substrates structure 53 shown in FIG. 5D.

In this specific and non-limiting example the wafer substrate of transducer elements 51 and the intermediating wafer substrate 52 are of circular shapes and thus their five (5) transducer elements wafer portions 14 and intermediating wafer portions 13 are arranged in cross shapes to maximize deployment of the substrate surface area. It is however noted that this construction technique is not limited to circular substrates, and that it may be similarly used with substrates having different shapes e.g., rectangular, triangular, polygonal, ellipsoid, etc. and with different arrangements of the wafer portions 13 and 14 therein.

Figure 5E:
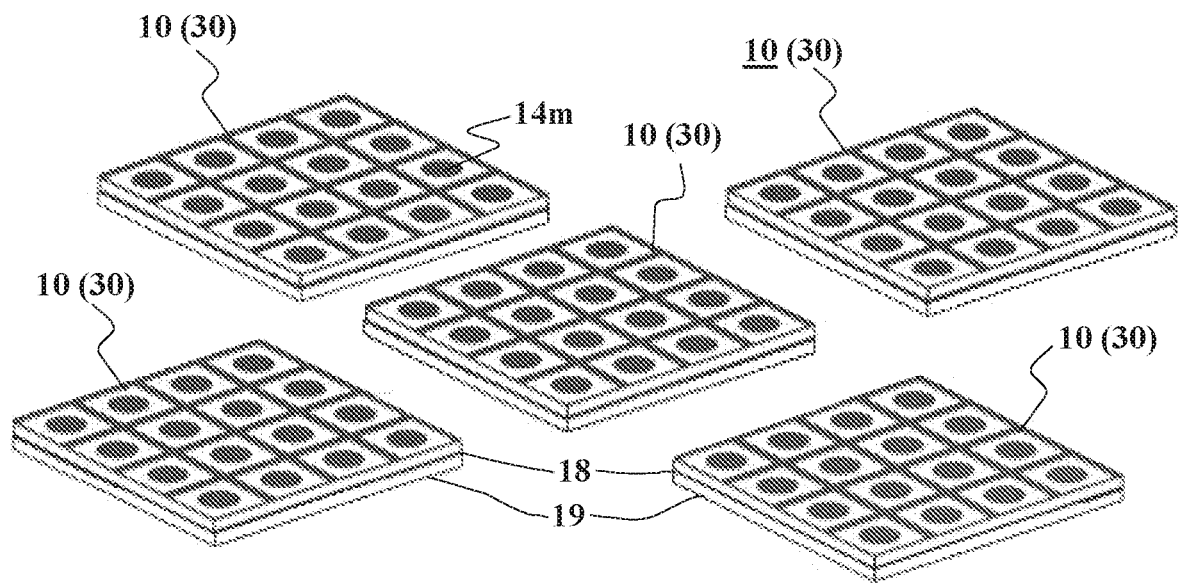
Figure 5F:
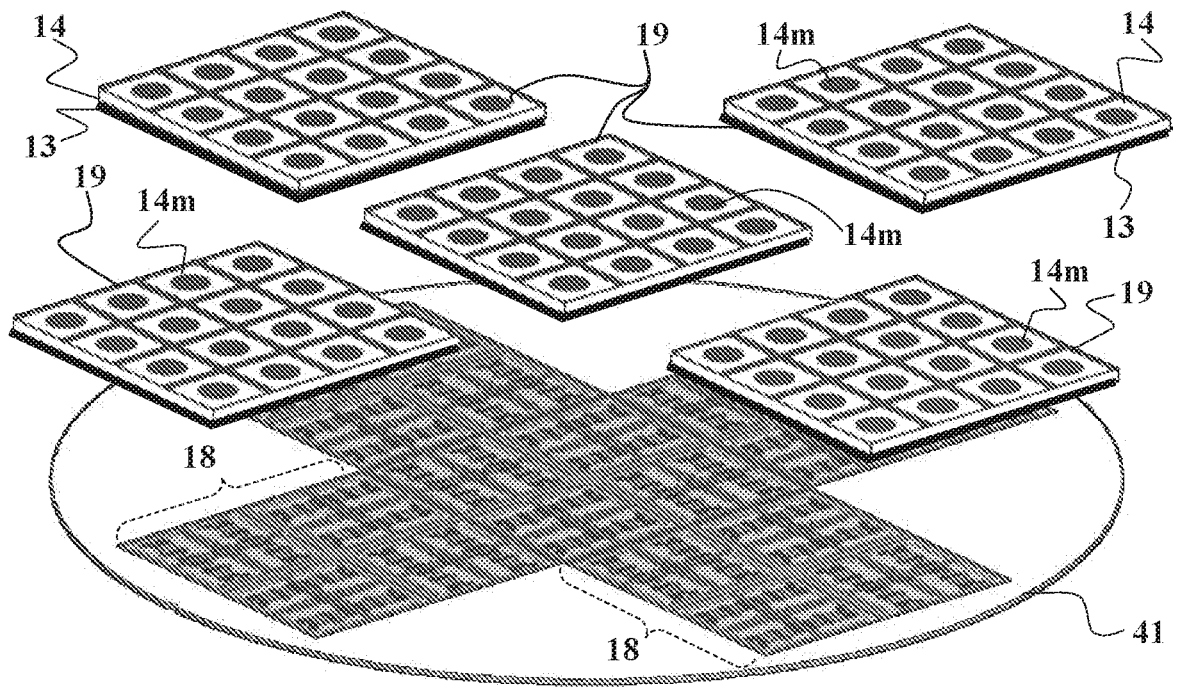

FIG. 5E schematically illustrates dicing the multilayered wafer substrates structure 53 to singulate therefrom semiconductor chip devices 10 (or 30) having a plurality of one or more transducer elements 14m operably ready for use. Another possible approach to construct the integrated circuit wafers with the embedded sensor elements 14m is schematically illustrated in FIG. 5F. In this embodiment the cap wafer substrate structure (42) is diced after the wafer substrate of transducer elements 51 is attached and electrically coupled to the intermediating wafer substrate 52, to thereby yield a plurality of cap wafer structures 19. In this specific and non-limiting example the cap wafer substrate structure (42) is diced to yield five (5) cap wafer structures 19. Each of the cap wafer structures 19 is then attached and electrically coupled to a respective base wafer structures 18 of the base wafer substrate structure 41 e.g., wafer level with wafer to wafer bonding.

Thereafter, the base wafer substrate structure 41 with the plurality of cap wafer structures 19 attached and electrically coupled thereto can be diced to singulate the respective plurality of semiconductor chip devices 10 (or 30) therefrom, as exemplified in FIG. 5E. This alternative approach for constructing the semiconductor chip devices 10 (or 30), of FIG. 5F, is usable for the constructions of semiconductor chip devices 10 (or 30) comprising optical sensors in the embedded sensor elements 14m.

Figure 6:
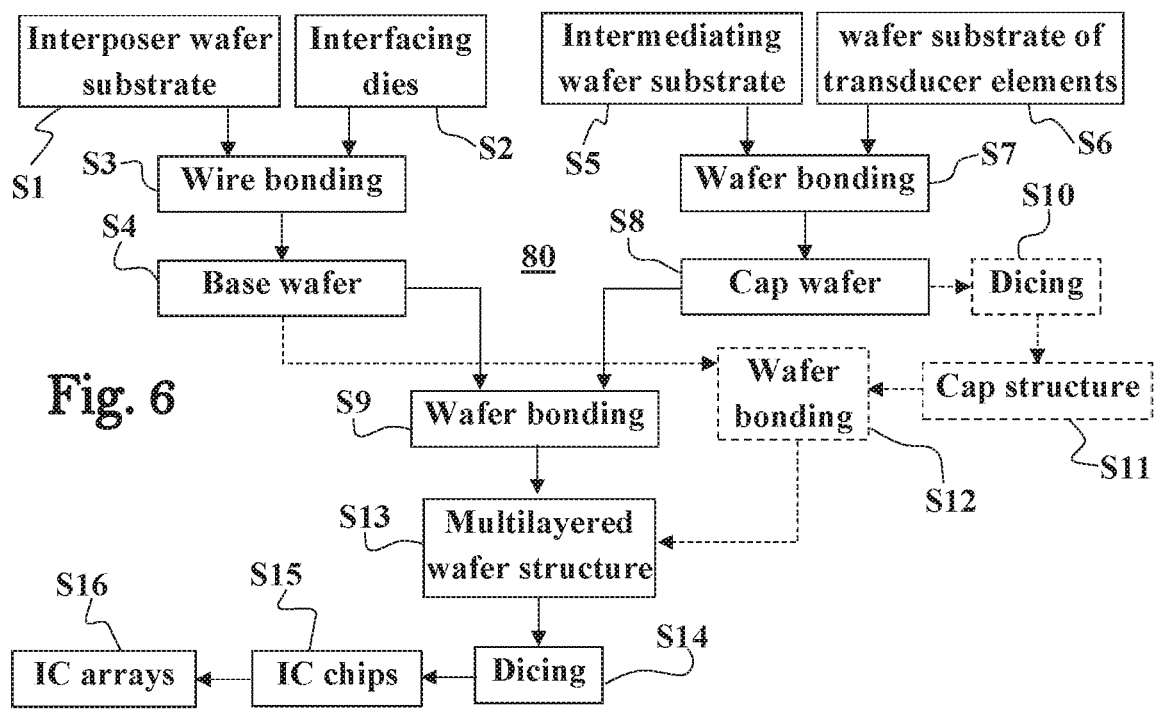
FIG. 6 is a flowchart schematically illustrating construction of a wafer of ICs having embedded sensor elements according to some possible embodiments.

FIG. 6 is a flowchart schematically illustrating construction process 80 of a wafer of ICs having embedded sensor elements according to some possible embodiments. The process can start with step S1, S2, S5 and S6, carried out simultaneously, or in any suitable order, for respectively preparing the interposer wafer substrate (50), the interfacing dies (12 or 32), the intermediating wafer substrate (52), and the wafer substrate of transducer elements (51).

Next, step S3 and S7, are carried out simultaneously, or in any suitable order. In step S3 the interfacing dies are attached and electrically coupled to the interposer wafer substrate by wire bonding, to thereby obtain in step S4 the base wafer substrate structure (41). In some embodiment electrical coupling of step S3 includes using the electric wiring and/or contact means 36, as described hereinabove with reference to FIGS. 4A and 4B. In step S7 the wafer substrate of transducer elements is attached and electrically coupled to the intermediating wafer substrate by wafer bonding, to thereby obtain in step S8 the cap wafer substrate structure (42).

In step S9 the cap wafer substrate structure is attached and electrically coupled to the base wafer substrate structure by wafer bonding, to thereby obtain in step S13 the multilayered wafer substrates structure (53). In step S14 the multilayered wafer substrates structure can be diced to singulate therefrom the integrated circuits/chips 10 (or 30) having the embedded transducer elements (14m), as illustrated in step S15. Optionally, in step S16 arrays of the diced integrated circuits/chips 10 (or 30) are assembled to form tiles of the diced chip devices, as exemplified hereinbelow in FIGS. 7 to 9.

In some embodiments steps S10 to S12 (marked by dashed-lines) are carried out in the construction process 80 instead of step S9, as illustrated in FIG. 5F. Particularly, in step S10 the cap wafer substrate structure (42) is diced to singulate therefrom the cap wafer structure 19. In step S12 the diced cap wafer structures 19 are attached and electrically coupled to the base wafer substrate structure (41) by wafer bonding, to thereby obtain the multilayered wafer substrates structure (53) of step S13. Thereafter, steps S14 to S16 may be carried, in the same manner described hereinabove.

Figure 7A:
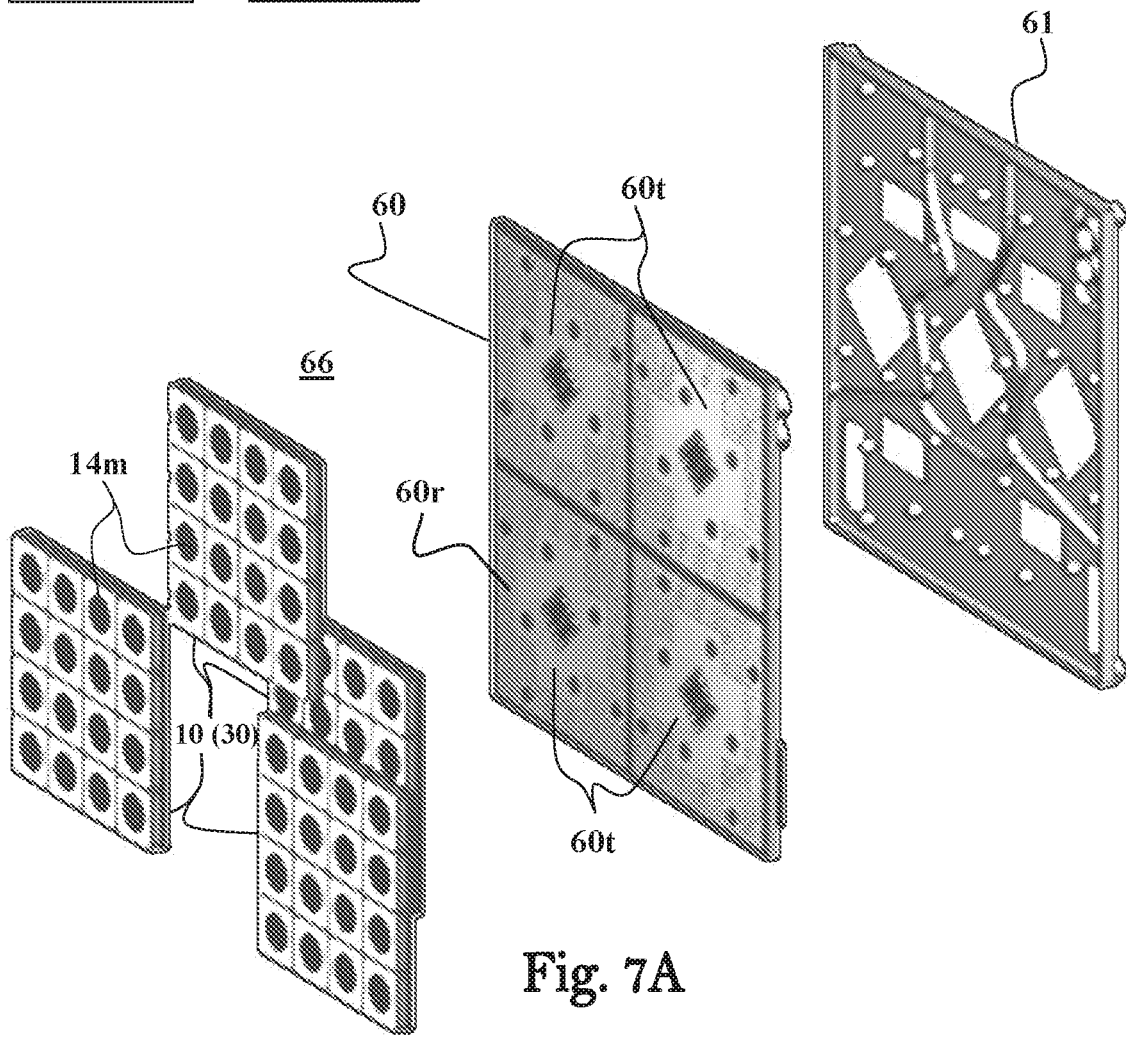
FIGS. 7A to 7D schematically illustrate construction of an array of the integrated circuits having embedded sensor elements to form a tile of sensor elements, wherein FIGS. 7A and 7B respectively show front and back perspective views of the components of the array, and FIGS. 7C and 7D respectively show back and front perspective views of the array.
Figure 7B:
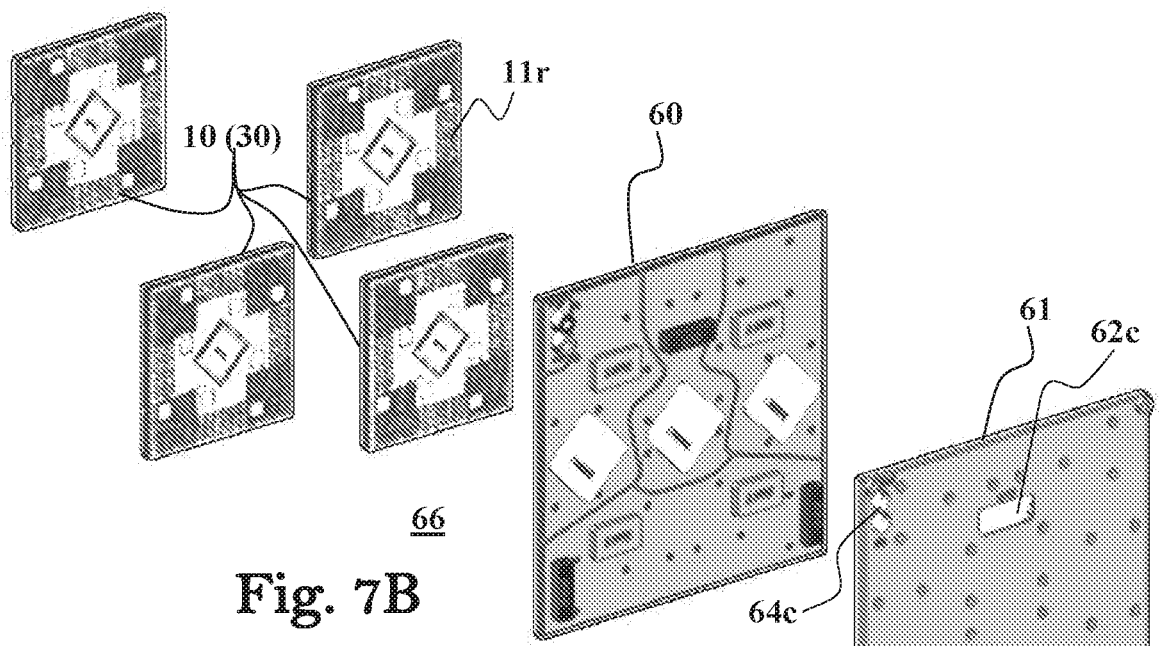

FIGS. 7A to 7D schematically illustrate construction of an array 66 of the multilayered integrated circuits 10 (or 30) having the embedded transducer elements 14m to form a tile of sensor elements. FIGS. 7A and 7B respectively show front and back perspective views of the array construction process. The multilayered integrated circuits 10 (or 30) are connected to a backend circuit board 60 having respective regions 60t with pluralities of electrical contacts 60r, each configured for electrically connecting one of the multilayered integrated circuits 10 (or 30) thereto. The backend circuit board 60, with the multilayered integrated circuits 10 (or 30) connected thereto, is then attached to a chassis 61 configured for support and interfacing the array to external circuitry/system (not shown). Optionally, but in some embodiments preferably, the chassis 61 is configured to dissipate heat produced by multilayered integrated circuits 10 (or 30) and transfer it to the external environment and/or to heat transfer media (e.g., air or other fluid) thermally coupled thereto.

Figure 7C:
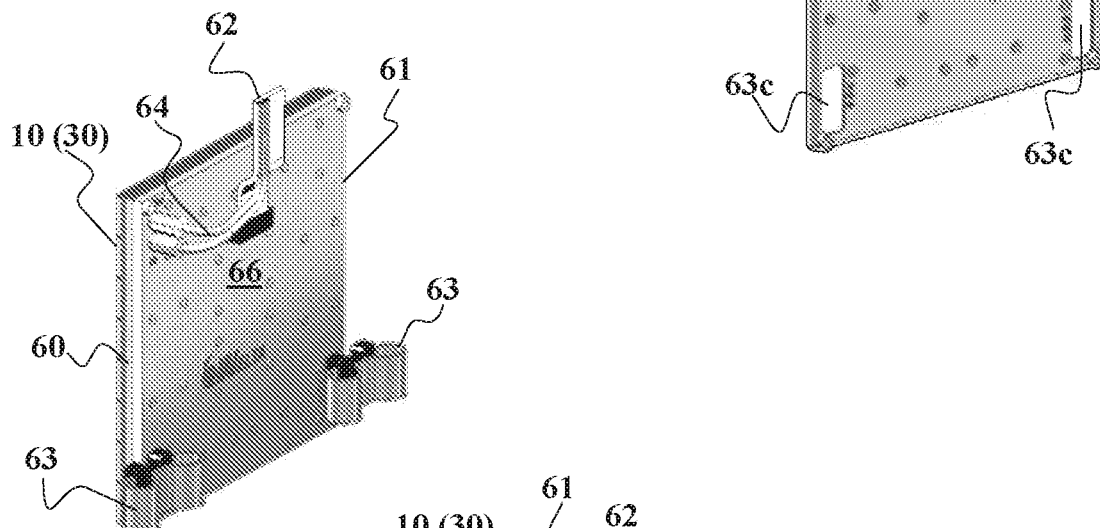
Figure 7D:
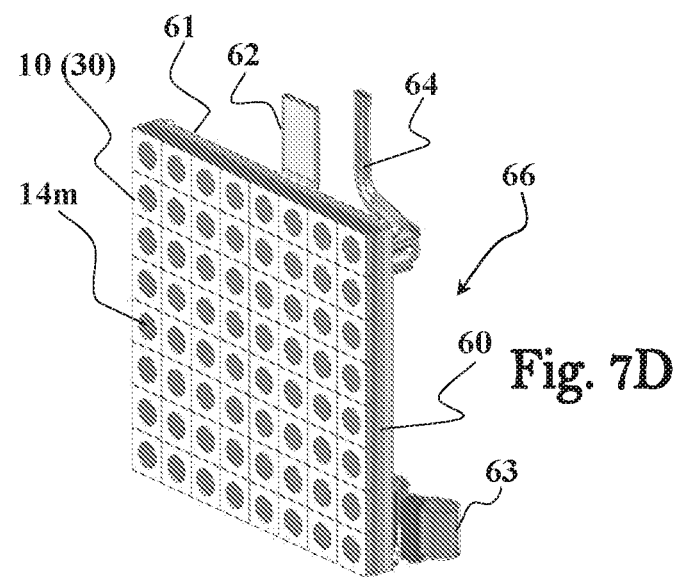

FIGS. 7C and 7D respectively show back and front perspective views of the array 66 after the multilayered integrated circuits 10 (or 30) are connecting to the backend circuit board 60, and connecting the backend circuit board 60 to the chassis 61. As seen in FIGS. 7B and 7C, the chassis 61 comprises power supply opening 64c configured for connection of power supply lines 64 to the backend circuit board 60, control lines opening 62c configured for connection of control lines 62 to the backend circuit board 60, and one or more concatenation opening 63c configured for connection of concatenation lines 63 to the backend circuit board 60, Accordingly, the array 66 is powered by power supply lines 64, and the operation of its multilayered integrated circuits 10 (or 30) is controlled by control signals/data received via control lines (e.g., bus) 62. Each array 66 can be connected in a cascade connection to one or two other arrays 66 via the concatenation lines 63 via the concatenation lines (e.g., bus) 63.

In this specific and non-limiting example two concatenation opening 63c are provided. The array 66 is 2×2 array of four (4) multilayered integrated circuits 10 (or 30), each having a 4×4 i.e., sixteen (16) embedded transducer elements 14m, such that a total of 8×8 i.e., sixty four (64) embedded transducer elements 14m is obtained.

Figure 8A:
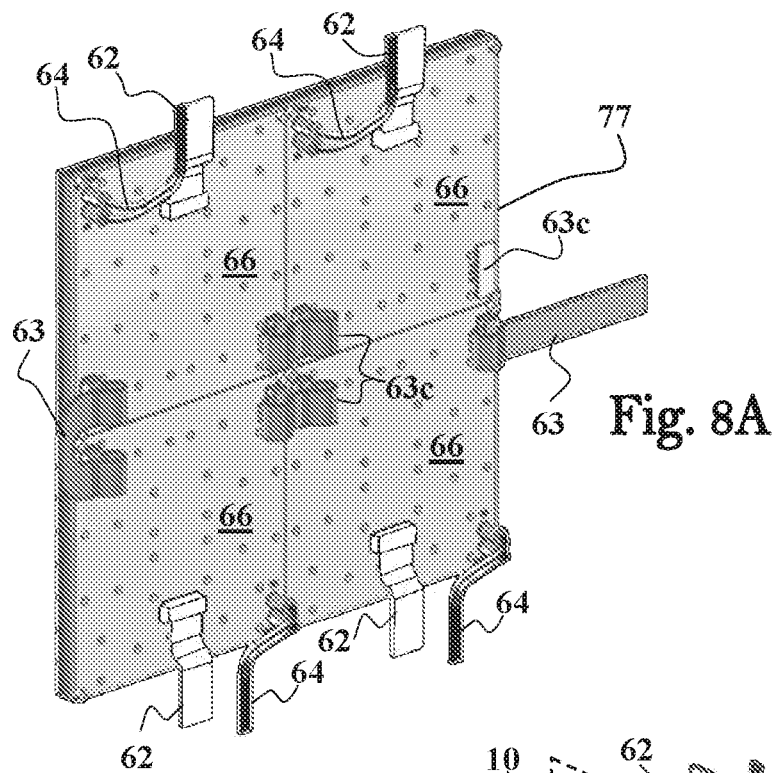
Figure 8B:
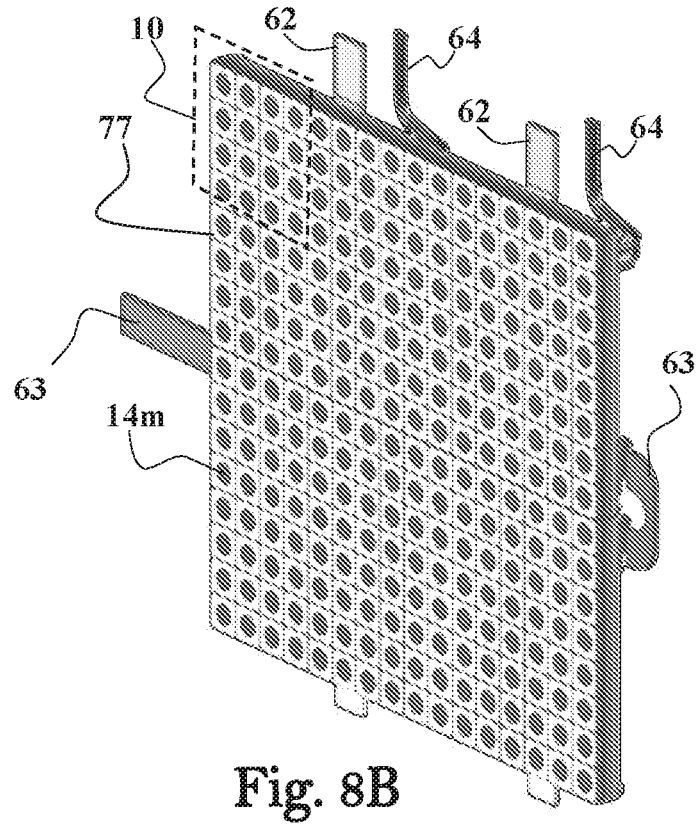

FIGS. 8A and 8B schematically illustrate a 2×2 assembly 77 i.e., having four (4), tiles 66 of the integrated circuits 10 (or 30), each tile having an array of 8×8 embedded sensor elements 14m. This way, an assembly 77 having a 16×16 array i.e., having 256, embedded sensor elements 14m is obtained. As seen, each one of the tiles 66 receives respective power supply lines 64 and control lines 62, and is in cascade connection with at least one other tile 66 of the assembly 77 via concatenation lines 63.

Figure 9A:
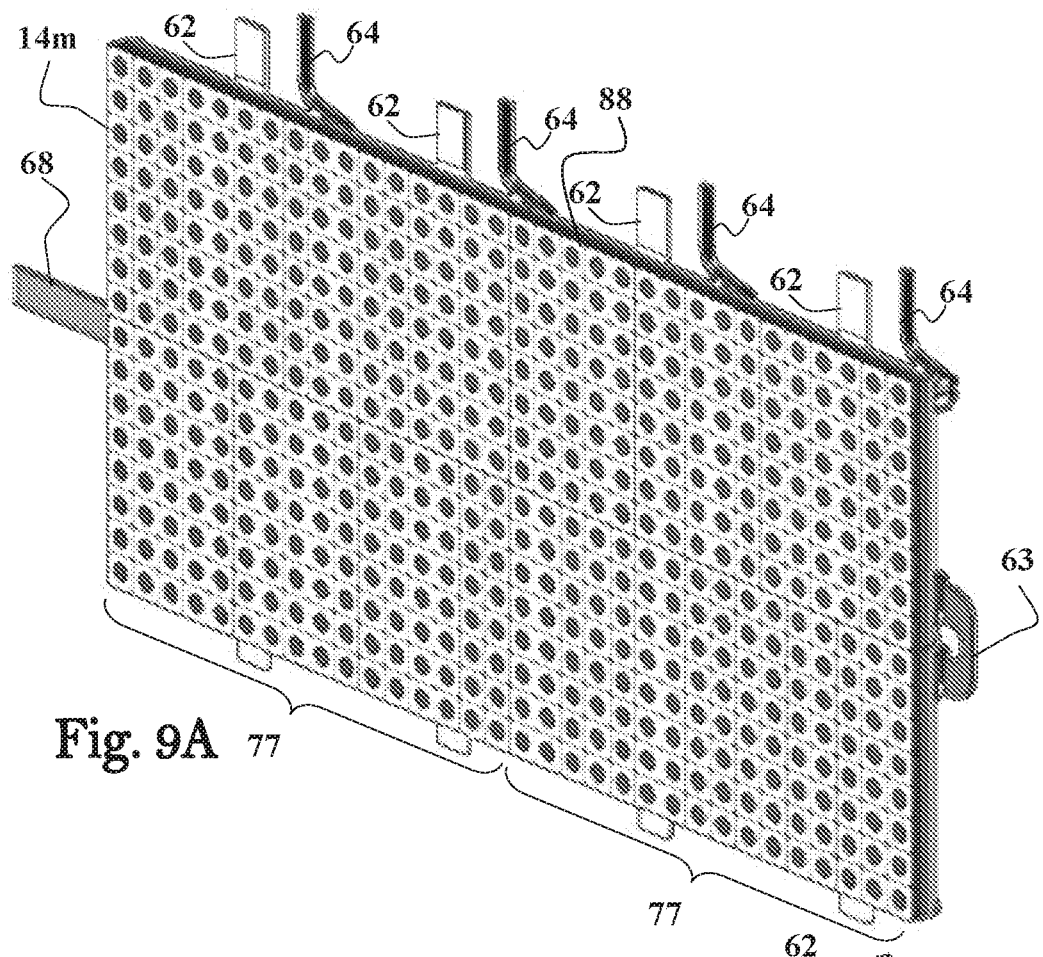
Figure 9B:
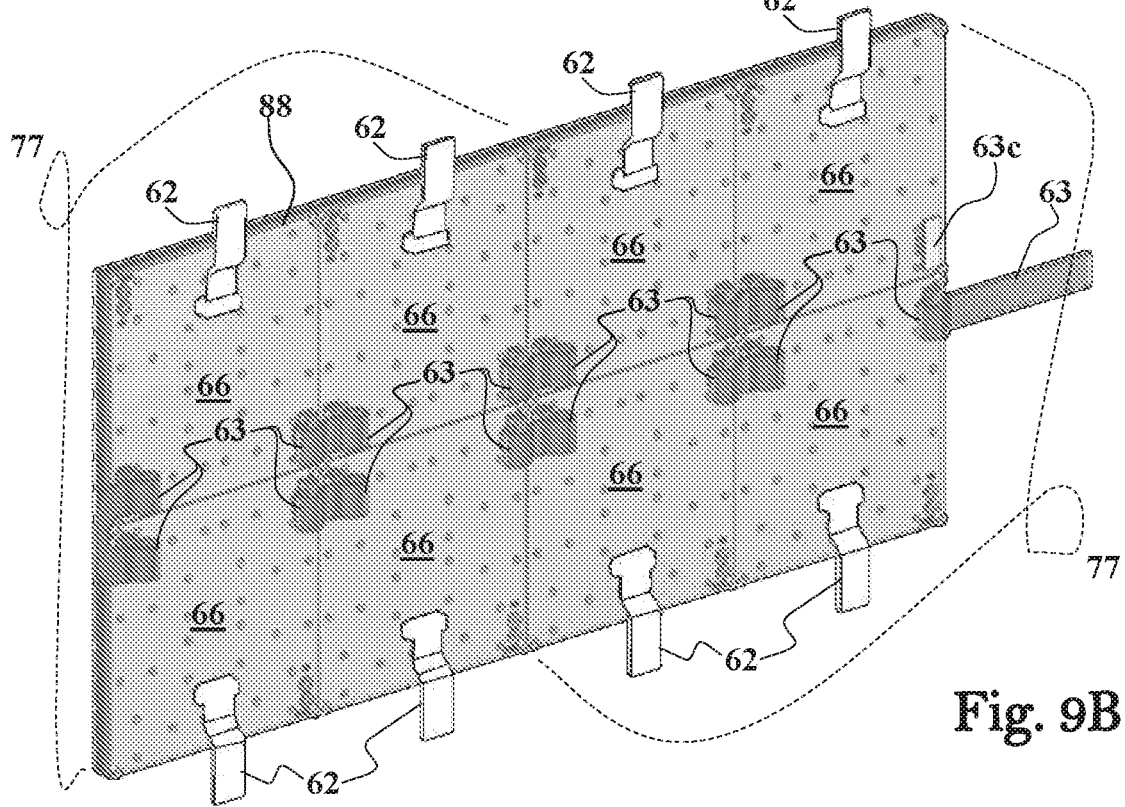

FIGS. 9A and 9B schematically illustrate a 1×2 assembly 88 i.e., having two (2), tiles assemblies 77 of the integrated circuits 10 (or 30), each tile assembly 77 having an array of 16×16 i.e., having 256 embedded sensor elements 14m. This way, an assembly of tile assemblies 88 having a 32×16 array i.e., having 512, embedded sensor elements 14m is obtained. As seen, the tiles 66 of each assembly 77 receives respective power supply lines 64 and control lines 62, and each tile 66 of the assemblies 77 is in cascade connection with at least one other tile 66 of the assembly 77 via concatenation lines 63.

Terms such as top, bottom, front, back, right, and left and similar adjectives in relation to orientation of the wafers, circuit boards, and their components refer to the manner in which the illustrations are positioned on the paper, not as any limitation to the orientations in which the apparatus can be used in actual applications.

It should also be understood that throughout this disclosure, where a process or method is shown or described, the steps of the method may be performed in any order or simultaneously, unless it is clear from the context that one step depends on another being performed first.

As described hereinabove and shown in the associated figures, the present invention provides integrated circuit having embedded transducer elements, and related methods. While particular embodiments of the invention have been described, it will be understood, however, that the invention is not limited thereto, since modifications may be made by those skilled in the art, particularly in light of the foregoing teachings. As will be appreciated by the skilled person, the invention can be carried out in a great variety of ways, employing more than one technique from those described above, all without exceeding the scope of the claims.

The invention claimed is:

1. An integrated circuit assembly having a top side and a bottom side, the integrated circuit assembly comprising:
    a base structure comprising:
        an interposer board; and a plurality of interfacing dies electrically coupled to said interposer board; and a cap structure comprising:
an intermediating board; and
a panel of active elements, forming a top side of said integrated circuit assembly and having a plurality of active elements electrically coupled to said intermediating board;

wherein said cap structure is attached to said base structure such that each one of said plurality of active elements is electrically coupled to at least one of said plurality of interfacing dies.

2. The integrated circuit assembly of claim 1, further comprising a plurality of electric wiring and/or contact means placed between and electrically connecting the interfacing dies and the interposer board.

3. The integrated circuit assembly of claim 2 wherein the interposer board comprises a plurality of electrical contactors on a first side thereof, and electrical contact elements configured to electrically couple between said plurality of electrical contactors and the interfacing dies via said electrical wiring and/or contact means.

4. The integrated circuit assembly of claim 3 wherein the intermediating board comprises a plurality of coupling components configured to electrically couple each one of said plurality of active elements with at least one of the plurality of interfacing dies.

5. The integrated circuit assembly of claim 4 wherein the interposer board is implemented in an interposer wafer; and
wherein the plurality of interfacing dies are electrically coupled to said interposer wafer by wire bonding.

6. The integrated circuit assembly of claim 5 wherein the intermediating board is implemented in an intermediating wafer;
wherein the panel of active elements is implemented in a wafer of active elements; and
wherein the intermediating board is connected to the panel of active elements by a wafer-to-wafer bonding.

7. The integrated circuit assembly of claim 5 wherein the cap structure is attached to the base structure by wafer-to-wafer bonding.

8. The integrated circuit assembly of claim 3, wherein said plurality of interfacing dies include a plurality of groups, each group comprising one or more interfacing die of said plurality of interfacing dies;
wherein said plurality of active elements comprise a plurality of active element groups, each active element group comprising one or more active element of said plurality of active elements;
wherein each group of said plurality of groups is associated with a respective active element group.

9. The integrated circuit assembly of claim 8, wherein, for each said group of interfacing dies and associated active element group, said group of interfacing dies includes one or more operating components configured to operate active elements of said associated active element group.

10. The integrated circuit assembly of claim 9 wherein said plurality of interfacing dies comprises a plurality of control modules;
wherein each group of the interfacing dies comprises at least one control module of said plurality of control modules, which control module is configured to control operation of the one or more operating components the group of interfacing dies.

11. The integrated circuit assembly of claim 10 wherein said plurality of interfacing dies comprises a main control unit configured to control the operation of said plurality of control modules.

12. The integrated circuit assembly of claim 1 wherein said plurality of interfacing dies comprises an plurality of operating components, each operating component of said plurality of operating components configured to operate at least one active element of said plurality of active elements.

13. The integrated circuit assembly of claim 12, wherein each active element of said plurality of active elements is configured to be operated by one or more operating component of said plurality of operating components.

14. The integrated circuit assembly of claim 1 wherein each one of the plurality active elements comprises at least one of the following: an optical sensor, a cavity sensor, a fluidic sensor, a strain sensor, an inductive and/or capacitive sensor, electric resistance and/or conductivity sensor, velocity sensor, acceleration sensor, orientation sensor, a microelectromechanical system (MEMS) sensor, and/or an antenna.

15. The integrated circuit assembly of claim 1, wherein one or more of said plurality of active elements is capable of interacting with, and/or sensing conditions or properties of a medium external to the integrated circuit assembly.

16. A method of constructing an integrated circuit assembly, the method comprising:
providing an interposer board, a plurality of interfacing dies, an intermediating board and a panel of active elements comprising a plurality of active elements;
electrically coupling a-said plurality of interfacing dies to an interposer wafer to provide a base wafer of said integrated circuit assembly, said interposer wafer configured to provide connectivity to said plurality of interfacing dies;
electrically coupling said active element wafer to an intermediating wafer to thereby-provide a cap wafer of said integrated circuit assembly, said intermediating wafer configured to provide connectivity to said plurality of active elements; and
attaching said cap wafer to said base wafer to position said panel of active elements at a top side of said integrated circuit such that each one of said plurality of active elements is electrically coupled to at least one of said plurality of interfacing dies.

17. The method of claim 16 wherein the attaching of the cap wafer to the base wafer comprises dicing the cap structure to singulate a plurality of cap structures, and attaching each of said plurality of cap structures to a respective region on said base wafer.

18. The method of claim 16 wherein the electrically coupling of the plurality of interfacing dies comprises wire bonding.

19. The method of claim 16 wherein the attaching of the cap wafer to the base wafer comprises wafer-to-wafer bonding.

20. The method of claim 16, wherein said electrically coupling said active element wafer to said intermediating wafer comprises wafer-to-wafer bonding.

* * * * *

UNITED STATES PATENT AND TRADEMARK OFFICE
CERTIFICATE OF CORRECTION

PATENT NO. : 12,406,963 B2
APPLICATION NO. : 18/003364
DATED : September 2, 2025
INVENTOR(S) : Yaniv Maydar et al.

It is certified that error appears in the above-identified patent and that said Letters Patent is hereby corrected as shown below:

In the Claims

Column 18, Line 33, Claim 16 currently reads as:
"electrically coupling a-said plurality of interfacing dies to..."
It should read as:
"electrically coupling said plurality of interfacing dies to..."

Column 18, Line 39, Claim 16 currently reads as:
"intermediating wafer to thereby-provide a cap wafer of..."
It should read as:
"intermediating wafer to provide a cap wafer of..."

Signed and Sealed this
Tenth Day of February, 2026

John A. Squires
*Director of the United States Patent and Trademark Office*